(12) United States Patent
Bibl et al.

(10) Patent No.: US 9,296,111 B2
(45) Date of Patent: Mar. 29, 2016

(54) MICRO PICK UP ARRAY ALIGNMENT ENCODER

(71) Applicant: LuxVue Technology Corporation, Santa Clara, CA (US)

(72) Inventors: Andreas Bibl, Los Altos, CA (US); Paul Argus Parks, Austin, TX (US)

(73) Assignee: LuxVue Technology Corporation, Santa Clara, CA (US)

( * ) Notice: Subject to any disclaimer, the term of this patent is extended or adjusted under 35 U.S.C. 154(b) by 246 days.

(21) Appl. No.: 13/948,039

(22) Filed: Jul. 22, 2013

(65) Prior Publication Data

US 2015/0021466 A1      Jan. 22, 2015

(51) Int. Cl.
*G01B 11/00* (2006.01)
*B25J 15/00* (2006.01)
*G01D 5/347* (2006.01)
*H01L 21/68* (2006.01)
*H01L 21/67* (2006.01)

(52) U.S. Cl.
CPC ............ *B25J 15/0085* (2013.01); *G01D 5/347* (2013.01); *H01L 21/67144* (2013.01); *H01L 21/681* (2013.01)

(58) Field of Classification Search
CPC ............... G01D 5/00; G03F 7/00; G03F 9/00; G01B 5/00; H01L 25/00; H01L 24/00; G03G 15/00; G02F 1/00
USPC .................................................. 356/399–401
See application file for complete search history.

(56) References Cited

U.S. PATENT DOCUMENTS

| | | | |
|---|---|---|---|
| 3,717,743 A | | 2/1973 | Costello |
| 3,935,986 A | | 2/1976 | Lattari et al. |
| 5,131,582 A | | 7/1992 | Kaplan et al. |
| 5,378,926 A | | 1/1995 | Chi et al. |
| 5,592,358 A | | 1/1997 | Shamouilian et al. |
| 5,740,956 A | | 4/1998 | Seo et al. |
| 5,774,219 A | * | 6/1998 | Matsuura ................. 356/499 |
| 5,794,839 A | | 8/1998 | Kimura et al. |
| 5,839,187 A | | 11/1998 | Sato et al. |
| 5,851,664 A | | 12/1998 | Bennett et al. |

(Continued)

FOREIGN PATENT DOCUMENTS

| | | |
|---|---|---|
| JP | 07-060675 A | 3/1995 |
| JP | 11-142878 A | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Tarifur Chowdhury
*Assistant Examiner* — Isiaka Akanbi
(74) *Attorney, Agent, or Firm* — Blakely, Sokoloff, Taylor & Zafman LLP

(57) ABSTRACT

Micro pick up arrays and methods for transferring micro devices from a carrier substrate are disclosed. In an embodiment, a micro pick up array alignment encoder detects relative position between a micro pick up array having an encoder scale and a target substrate having a corresponding reference scale. In an embodiment, the micro pick up array alignment encoder facilitates alignment of the micro pick up array with the target substrate.

31 Claims, 25 Drawing Sheets

(56) References Cited

U.S. PATENT DOCUMENTS

| | | | |
|---|---|---|---|
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,080,650 A | 6/2000 | Edwards | |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,683,368 B1 | 1/2004 | Mostafazadeh | |
| 6,786,390 B2 | 9/2004 | Yang et al. | |
| 6,791,699 B2* | 9/2004 | Aoki | 356/616 |
| 6,838,688 B2* | 1/2005 | Aoki | 250/559.29 |
| 6,878,607 B2 | 4/2005 | Inoue et al. | |
| 6,918,530 B2 | 7/2005 | Shinkai et al. | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,439,549 B2 | 10/2008 | Marchl et al. | |
| 7,585,703 B2 | 9/2009 | Matsumura et al. | |
| 7,628,309 B1 | 12/2009 | Erikssen et al. | |
| 7,714,336 B2 | 5/2010 | Imai | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,989,266 B2 | 8/2011 | Borthakur et al. | |
| 7,999,454 B2 | 8/2011 | Winters et al. | |
| 8,023,248 B2 | 9/2011 | Yonekura et al. | |
| 8,076,670 B2 | 12/2011 | Slater et al. | |
| 8,186,568 B2 | 5/2012 | Coronel et al. | |
| 8,333,860 B1 | 12/2012 | Bibl et al. | |
| 8,349,116 B1 | 1/2013 | Bibl et al. | |
| 2001/0029088 A1 | 10/2001 | Odajima et al. | |
| 2002/0076848 A1 | 6/2002 | Spooner et al. | |
| 2003/0010975 A1 | 1/2003 | Gibb et al. | |
| 2003/0177633 A1 | 9/2003 | Haji et al. | |
| 2004/0100164 A1 | 5/2004 | Murata et al. | |
| 2004/0232439 A1 | 11/2004 | Gibb et al. | |
| 2004/0263860 A1* | 12/2004 | Johnson | 356/499 |
| 2004/0266048 A1 | 12/2004 | Platt et al. | |
| 2005/0224822 A1 | 10/2005 | Liu | |
| 2005/0232728 A1 | 10/2005 | Rice et al. | |
| 2006/0055035 A1 | 3/2006 | Lin et al. | |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0214299 A1 | 9/2006 | Fairchild et al. | |
| 2007/0048902 A1 | 3/2007 | Hiatt et al. | |
| 2007/0166851 A1 | 7/2007 | Tran et al. | |
| 2007/0194330 A1 | 8/2007 | Ibbetson et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0205027 A1 | 8/2008 | Coronel et al. | |
| 2008/0283190 A1 | 11/2008 | Papworth et al. | |
| 2008/0283849 A1 | 11/2008 | Imai | |
| 2008/0303038 A1 | 12/2008 | Grotsch et al. | |
| 2009/0068774 A1 | 3/2009 | Slater et al. | |
| 2009/0072382 A1 | 3/2009 | Guzek | |
| 2009/0146303 A1 | 6/2009 | Kwon | |
| 2009/0303713 A1 | 12/2009 | Chang et al. | |
| 2009/0314991 A1 | 12/2009 | Cho et al. | |
| 2010/0052004 A1 | 3/2010 | Slater et al. | |
| 2010/0105172 A1 | 4/2010 | Li et al. | |
| 2010/0123164 A1 | 5/2010 | Suehiro et al. | |
| 2010/0176415 A1 | 7/2010 | Lee et al. | |
| 2010/0188794 A1 | 7/2010 | Park et al. | |
| 2010/0200884 A1 | 8/2010 | Lee et al. | |
| 2010/0203659 A1 | 8/2010 | Akaike et al. | |
| 2010/0203661 A1 | 8/2010 | Hodota | |
| 2010/0213471 A1 | 8/2010 | Fukasawa et al. | |
| 2010/0214777 A1 | 8/2010 | Suehiro et al. | |
| 2010/0227263 A1* | 9/2010 | Sato | 430/30 |
| 2010/0248484 A1 | 9/2010 | Bower et al. | |
| 2010/0276726 A1 | 11/2010 | Cho et al. | |
| 2011/0003410 A1 | 1/2011 | Tsay et al. | |
| 2011/0049540 A1 | 3/2011 | Wang et al. | |
| 2011/0132655 A1 | 6/2011 | Horiguchi et al. | |
| 2011/0132656 A1 | 6/2011 | Horiguchi et al. | |
| 2011/0151602 A1 | 6/2011 | Speier | |
| 2011/0159615 A1 | 6/2011 | Lai | |
| 2011/0210357 A1 | 9/2011 | Kaiser et al. | |
| 2011/0297914 A1 | 12/2011 | Zheng et al. | |
| 2011/0312131 A1 | 12/2011 | Renavikar et al. | |
| 2012/0064642 A1 | 3/2012 | Huang et al. | |
| 2012/0134065 A1 | 5/2012 | Furuya et al. | |
| 2013/0019996 A1 | 1/2013 | Routledge | |
| 2013/0038416 A1 | 2/2013 | Arai et al. | |
| 2013/0130440 A1 | 5/2013 | Hu et al. | |
| 2013/0134591 A1 | 5/2013 | Sakamoto et al. | |
| 2013/0161682 A1 | 6/2013 | Liang et al. | |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-186829 A | 8/2010 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

(56) References Cited

OTHER PUBLICATIONS

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Xiaojing Zhang, "Silicon microsurgery-force sensor based on diffractive optical MEMS encoders", Sensor Review, vol. 24, No. 2004, pp. 37-41, Emerald Group Publishing Limited, ISSN 0260-2288.

X.J. Zhang et al, "Micromachined silicon force sensor based on diffractive optical encoders for characterization of microinjection", Elsevier, www.elsevier.com/locate/sna, Nov. 28, 2003, 7 pages.

* cited by examiner

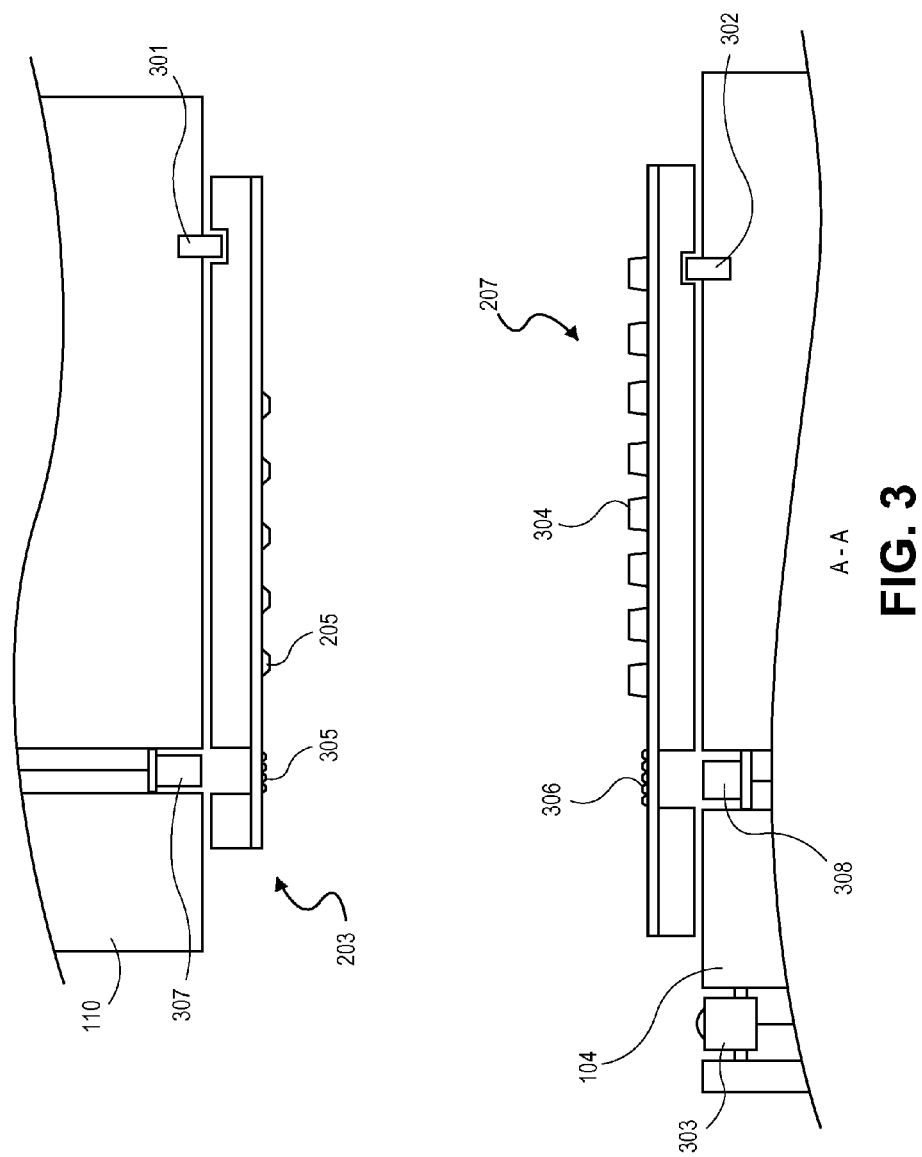

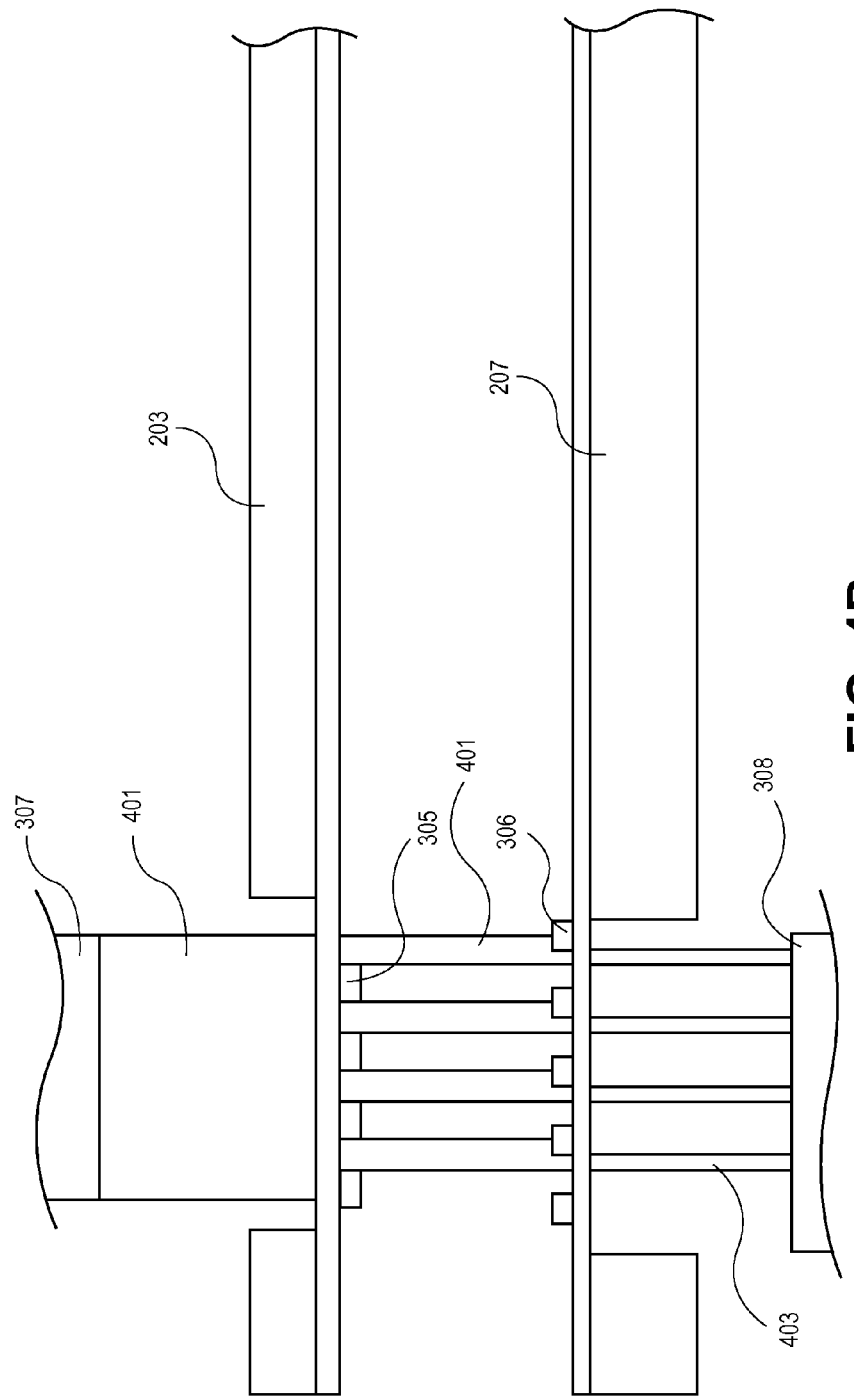

MICRO PICK UP ARRAY ALIGNMENT ENCODER

BACKGROUND

1. Field

The present invention relates to alignment of transfer heads with a target substrate to facilitate transfer of micro devices.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring devices include, e.g., "transfer printing", which involves using a transfer wafer to pick up an array of devices from a donor wafer. The array of devices are then bonded to a receiving wafer before removing the transfer wafer. Some transfer printing process variations have been developed to selectively bond and de-bond a device during the transfer process. In both traditional and variations of the transfer printing technologies, the transfer wafer is de-bonded from a device after bonding the device to the receiving wafer. In addition, the entire transfer wafer with the array of devices is involved in the transfer process.

Linear encoders and rotary encoders can provide information about position or motion of mechanical system components. For example, optical linear encoders have been used in coordinate-measuring machines and can provide absolute reference signals for positioning. Traditionally, encoders have not been integrated within MEMS-scale devices, and where they have been used, the encoders do not detect rotational or positional alignment of the MEMS device components.

SUMMARY OF THE INVENTION

Micro pick up arrays and methods for transferring micro devices from a carrier substrate are disclosed. In an embodiment, a micro pick up array includes an array of electrostatic transfer heads supported by a base substrate and one or more encoder scales over the base substrate. For example, micro pick up array may include a plurality of encoder scales located within different quadrants of the base substrate. An encoder scale may include one or more gratings having a plurality of parallel lines. For example, the encoder scale may include a pair of gratings, where parallel lines of a first grating are orthogonal to parallel lines of a second grating. A hole may be located through the base substrate of the micro pick up array opposite and below the gratings. Each grating may further include an outer perimeter, and the hole through the base substrate includes a wall profile around the outer perimeter. In an embodiment, one or more of the gratings of the encoder scale may include a grating having a first column of parallel lines and a second column of parallel lines that are offset from each other in a direction orthogonal to the parallel lines. For example, the columns may be offset from each other by a distance less than a line width of the lines in the columns. Furthermore, the first column of parallel lines may be laterally adjacent to the second column of parallel lines.

In an embodiment, a micro pick up array alignment encoder includes a micro pick up array, a light source, and a photodetector. The micro pick up array may include an array of electrostatic transfer heads supported by a base substrate and an encoder scale over the base substrate. The light source may emit light toward the encoder scale and the photodetector may receive the emitted light. For example, the light source may be an infrared light source coupled with the micro pick up array to emit collimated light toward the encoder scale. In an embodiment, the micro pick up array alignment encoder also includes a target substrate having a reference scale such that the photodetector receives the emitted light from the reference scale. The photodetector may be coupled with the target substrate.

In an embodiment, the encoder scale of the micro pick up array alignment encoder has an encoder grating with a plurality of parallel first lines and the reference scale of the micro pick up array alignment encoder may have a reference grating with a plurality of parallel second lines. For example, there may be equal numbers of parallel first lines in the encoder grating as parallel second lines in the reference grating. Furthermore, the encoder grating may have an encoder grating width different from a reference grating width of the reference grating. In an embodiment, the encoder grating includes a first column of parallel first lines and a second column of parallel first lines. The parallel first lines in the first column and the parallel lines in the second column may be offset from each other in a direction orthogonal to the parallel first lines. For example, the columns may be offset from each other by a distance less than a line width of the lines in the columns. Furthermore, the first column of parallel first lines may be laterally adjacent to the second column of parallel first lines.

In an embodiment, the target substrate of the micro pick up array alignment encoder includes a carrier substrate with an array of micro devices supported by a silicon substrate and the reference scale over the silicon substrate. In an alternative embodiment, the target substrate includes a receiving substrate having a thin film transistor (TFT) substrate including a pixel area and a non-pixel area with the reference scale over the non-pixel area.

In an embodiment, a method includes emitting light from a light source through an encoder scale on a micro pick up array to a photodetector, wherein the micro pick up array includes an array of electrostatic transfer heads. The method, in an embodiment, further includes moving the encoder scale relative to a reference scale on a target substrate and receiving, by the photodetector, a detected light from the reference scale. The emitted light may transmit through the reference scale to the photodetector or may reflect from the reference scale to the photodetector. Based on the detected light, an alignment between the micro pick up array and the target substrate may be determined.

In an embodiment, the encoder scale includes a grating having a first column of parallel lines and a second column of parallel lines. The parallel lines in the first column and the parallel lines in the second column may be offset from each other in a direction orthogonal to the parallel lines. Accordingly, receiving the detected light from the reference scale may include receiving emitted light passing through the first column with the photodetector and receiving the emitted light passing through the second column with a second photodetector. Furthermore, the detected light passing through the first column may be compared with the detected light passing through the second column to determine, based on the comparison, the alignment between the micro pick up array and the target substrate.

In an embodiment, determining the alignment includes determining a linear alignment based on a detected peak vale of the detected light. In an embodiment, detecting the peak value may include detecting the peak value in the emitted light passing through the first column and detecting a second peak value of the emitted light passing through the second column after moving the encoder scale relative to the reference scale by a phase shift distance. The method may also include measuring the phase shift distance and determining an angular alignment based on the measured phase shift distance.

In an embodiment, a non-transitory computer readable medium includes instructions that when executed by a computer cause a micro pick up array alignment encoder to emit light from a light source through an encoder scale to a photodetector. The encoder scale may be on a micro pick up array having an array of electrostatic transfer heads. The instructions may further cause the micro pick up array alignment encoder to move the encoder scale relative to a reference scale on a target substrate and to receive a detected light from the reference scale by a photodetector. The micro pick up array alignment encoder may further be caused to determine an alignment between the micro pick up array and the target substrate based on the detected light.

BRIEF DESCRIPTION OF THE DRAWINGS

FIG. 3 is a cross-section side view of a micro pick up array holder holding a micro pick up array having an encoder scale over a carrier substrate having a reference scale, taken about section line A-A of FIG. 2, in accordance with an embodiment of the invention.

FIG. 4B is a side view of a micro pick up array alignment encoder including a micro pick up array having an encoder scale over a carrier substrate having a transmissive reference scale in a second configuration in accordance with an embodiment of the invention.

DETAILED DESCRIPTION OF THE INVENTION

Figure 1:
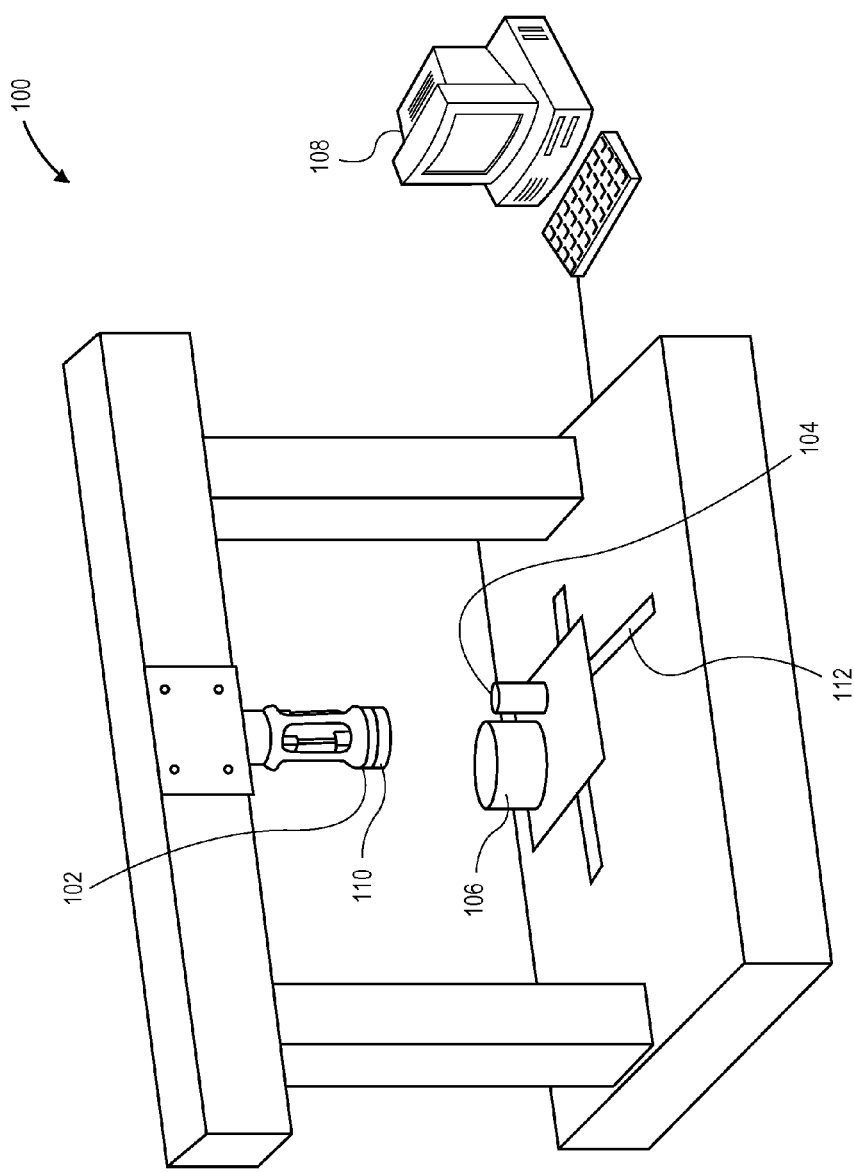
FIG. 1 is a perspective view illustration of a mass transfer tool in accordance with an embodiment of the invention.

Embodiments of the present invention describe apparatuses and methods for alignment of transfer heads with a target substrate to facilitate transfer of micro devices. For example, the micro device or array of micro devices may be any of the micro LED device structures illustrated and described in related U.S. Patent Publications 2013/0126891 and 2013/0126081 and U.S. patent application Ser. Nos. 13/458,932 and 13/625,825. While some embodiments of the present invention are described with specific regard to micro LED devices, the embodiments of the invention are not so limited and certain embodiments may also be applicable to other micro devices such as diodes, transistors, integrated circuit (IC) chips, and MEMS.

In various embodiments, description is made with reference to the figures. However, certain embodiments may be practiced without one or more of these specific details, or in combination with other known methods and configurations.

In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between", and "on" as used herein may refer to a relative position of one layer or component with respect to other layers or components. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures may refer to the scale of 1 to 100 µm. However, embodiments of the present invention are not necessarily so limited, and certain aspects of the embodiments may be applicable to larger and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, a top contact surface of each micro device or electrostatic transfer head has a maximum dimension of 1 to 100 µm. In an embodiment, the top contact surface of each micro device or electrostatic transfer head has a maximum dimension of 3 to 20 µm. In an embodiment, a pitch of an array of micro devices, and a pitch of a corresponding array of electrostatic transfer heads, may be (1 to 100 µm) by (1 to 100 µm), for example, a 20 µm by 20 µm or a 5 µm by 5 µm pitch.

In an aspect, embodiments of the invention describe systems and methods for the mass transfer of micro devices using a micro pick up array alignment encoder. The micro pick up array alignment encoder includes a micro pick up array having an encoder scale and a target substrate having a corresponding reference scale. In an embodiment, the encoder scale and the reference scale include complementary patterns such that light passing through the encoder scale pattern will transmit through or reflect from the reference scale pattern based on the relative position between the micro pick up array and the target substrate. Furthermore, the transmitted or reflected light may vary with relative position of the micro pick up array and target substrate such that the transmitted or reflected light correlates with alignment, either positional or rotational, between the micro pick up array and the target substrate. Thus, the light may be received and processed to determine alignment between the micro pick up array and the target substrate.

In one aspect, an embodiment of a micro pick up array alignment encoder facilitates positional alignment between a micro pick up array and a target substrate on a sub-nanometer scale. Positional alignment may refer to relative positioning along axes of a plane. By positionally aligning a micro pick up array and target substrate, a reference location may be established with the micro pick up array alignment encoder, and a distance between an electrostatic transfer head on micro pick up array and a target location on a target substrate may be calculated. Thus, the electrostatic transfer head may be moved into alignment with the target location, e.g., a micro device.

In another aspect, an embodiment of a micro pick up array alignment encoder facilitates rotational alignment between a micro pick up array and a target substrate. Rotational alignment may refer to relative positioning about an axis orthogonal to the micro pick up array and target substrate. In an embodiment, the rotational alignment may be determined with reference to a plurality of encoder/reference scale pairs in separate regions of the micro pick up array and target substrate. Distances between the pairs may be measured and used to calculate angular alignment between the micro pick up array and the target substrate. Alternatively, rotational alignment may be determined with reference to a single encoder/reference scale pair, in which either the encoder scale or the reference scale includes a grating with offset columns of parallel lines. Light passing through the columns can be converted into a plurality of signals that may be processed to measure a phase shift between the signals, and the phase shift may be used to infer angular alignment. By establishing an estimate of angular alignment, micro pick up array may be rotated into alignment with the target substrate.

In an aspect, an embodiment of a micro pick up array alignment encoder includes a micro pick up array having an encoder scale and/or a target substrate having a reference scale, in which the encoder scale and/or the reference scale are sized in the micro dimensional scale. For example, the encoder/reference scales may have gratings with an overall area of about 1 square millimeter, and an outer perimeter of approximately 1 millimeter by 1 millimeter along each side. Furthermore, the scales may include gratings with a plurality of parallel lines spaced apart from each other by about 1 to 5 µm, and with line widths of about 1 to 5 µm. In an embodiment, the gratings of the encoder scale and the reference scale may include different widths to ensure that one grating may be shifted laterally relative to the other grating with little effect on the detected light passing through the scales.

Referring to FIG. 1, a perspective view illustration of a mass transfer tool is shown in accordance with an embodiment of the invention. Mass transfer tool 100 may include a mass transfer tool manipulator assembly 102 for picking up an array of micro devices from a carrier substrate held by a carrier substrate holder 104 and for transferring and releasing the array of micro devices onto a receiving substrate held by a receiving substrate holder 106. Operation of mass transfer tool 100 and mass transfer tool manipulator assembly 102 may be controlled at least in part by a computer system 108. In an embodiment, computer system 108 may control the operation of mass transfer tool manipulator assembly 102 based on feedback signals received from various sensors, e.g., photodetectors, coupled with the mass transfer tool 100 as described in further detail below.

In an embodiment, components and subassemblies of mass transfer tool 100 and mass transfer tool manipulator assembly 102 may be moved relative to each other. For example, mass transfer tool 100 and mass transfer tool manipulator assembly 102 may adjust spatial relationships between components in order to facilitate transferring an array of micro devices using an array of electrostatic transfer heads. Such adjustments may require precise movements in multiple degrees of freedom. For example, mass transfer tool manipulator assembly 102 may include various actuators for adjusting a micro pick up array holder 110 with at least three degrees of freedom, e.g., tipping, tilting, and movement in a z-direction. Similarly, carrier substrate holder 104 may be moved by an x-y stage 112 of mass transfer tool 100, having at least two degrees of freedom, e.g., along orthogonal axes within a horizontal plane. Thus, in an embodiment, an array of electrostatic transfer heads supported by a micro pick up array held by micro pick up array holder 110 and an array of micro devices supported by a carrier substrate held by carrier substrate holder 104 may be precisely moved relative to each other with five degrees of freedom. Furthermore, the inclusion of additional actuators in mass transfer tool 100 may provide more degrees of freedom between the array of micro devices and the array of electrostatic transfer heads, or between other components of the system.

Figure 2:
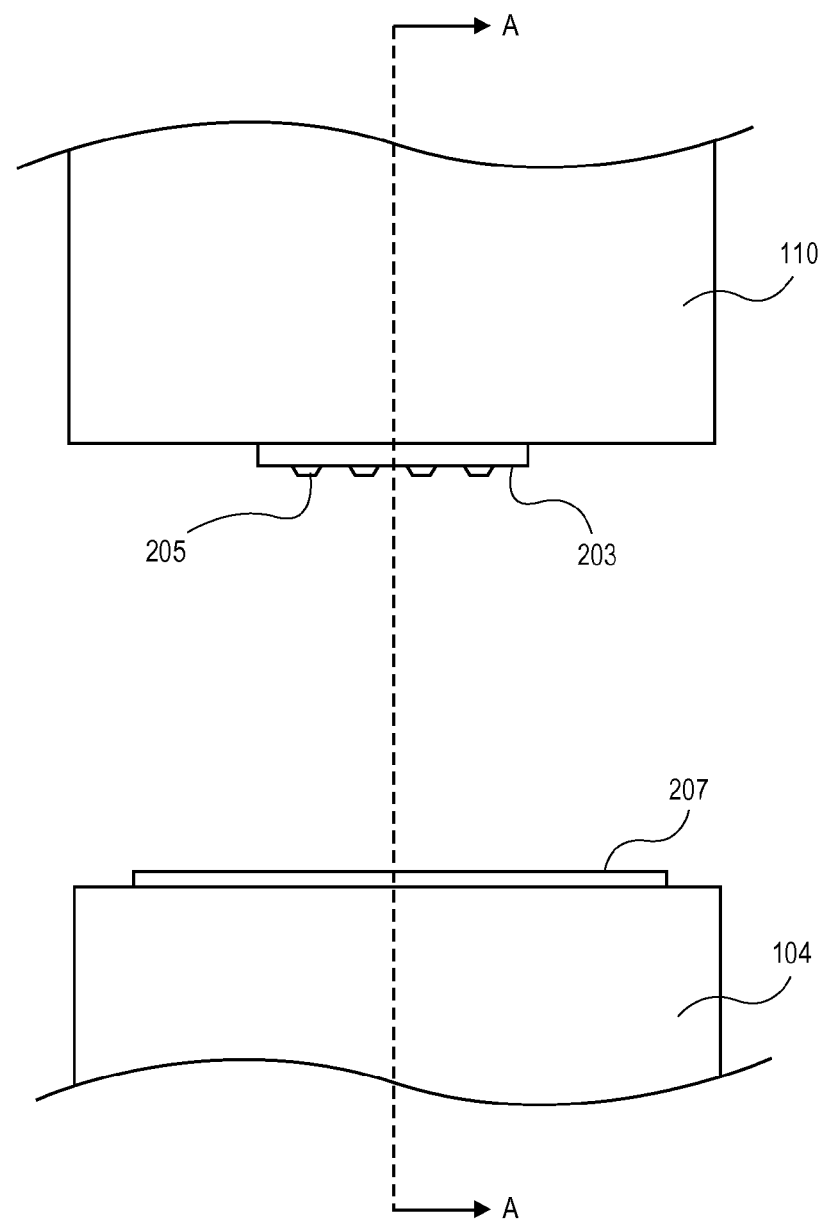
FIG. 2 is a side view illustration of a micro pick up array holder holding a micro pick up array over a carrier substrate in accordance with an embodiment of the invention.

Referring to FIG. 2, a side view illustration of a micro pick up array holder holding a micro pick up array over a carrier substrate is shown in accordance with an embodiment of the invention. In an embodiment, micro pick up array holder 110 coupled with mass transfer tool manipulator assembly 102 retains a micro pick up array 203. Micro pick up array 203 may include an array of electrostatic transfer heads 205 supported on a surface facing a carrier substrate 207. More specifically, carrier substrate 207 may be held by carrier substrate holder 104 under micro pick up array 203 to allow for micro pick up array 203 and carrier substrate 207 to be moved relative to each other in order to transfer micro devices from carrier substrate 207 using the array of electrostatic transfer heads 205. In an embodiment, electrostatic transfer heads 205 may be positioned adjacent to the micro devices and an electrostatic voltage may be supplied to the electrostatic transfer heads 205 to electrostatically grip the micro devices. As described above, in an embodiment, the top contact surface of each micro device or electrostatic transfer head 205 may have a maximum dimension of 3 to 20 µm. Thus, effective gripping and transfer of the micro devices with electrostatic transfer heads 205 requires accurate alignment of the micro pick up array 203 with the carrier substrate 207.

Referring to FIG. 3, a cross-section side view of a micro pick up array holder holding a micro pick up array having an encoder scale over a carrier substrate having a reference scale, taken about section line A-A of FIG. 2, is shown in accordance with an embodiment of the invention. Micro pick up array holder 110 may retain micro pick up array 203 using numerous manners of fastening, including mechanical, e.g., clips, screws, tabs, etc., or electrical, e.g., electrostatic gripping force. Similarly, carrier substrate 207 may be retained by carrier substrate holder 104 using various retention means. Optionally, positioning of micro pick up array 203 relative to micro pick up array holder 110 and positioning of carrier substrate 207 relative to carrier substrate holder 104 may be facilitated with one or more reference features. For example, one or more reference pin 301 may be press fit into micro pick up array holder 110 and used to engage with a corresponding bore in micro pick up array. Thus, each time micro pick up array 203 is replaced, reference pin 301 may engage the corresponding bore to ensure that the replacement micro pick up array 203 is located in the same location as the replaced micro pick up array 203. One or more reference pin 302 may be used to similarly locate carrier substrate 207 relative to carrier substrate holder 104. Other reference features, such as reference edges, marks, etc., may be used instead of reference pins. In an embodiment, the reference features facilitate repeatable positioning of micro pick up array 203 and carrier substrate 207 relative to their respective holders within a tolerance of about 100 µm.

After locating micro pick up array 203 and carrier substrate 207 relative to their respective holders, the fastened carrier substrate 207 and micro pick up array 203 may then be moved relative to each other until a relational datum is established. The relational datum may be, for example, a location at which a feature on carrier substrate 207 is known to be roughly aligned with a corresponding feature on micro pick up array 203. For example, in an embodiment camera 303 may be fixed relative to carrier substrate 207 within carrier substrate holder 104. Distance between camera 303 and reference pin 302 may be known, and thus, distance between camera 303 and other locations on carrier substrate 207 may be calculated based on the other locations' known position relative to reference pin 302. Upward looking camera 303 may be used to visually identify a known feature on micro pick up array 203, such as a structural feature, e.g., a corner, or another reference feature, e.g., an encoder scale 305, electrostatic transfer head 205, alignment marker, etc. After identifying the known feature on micro pick up array 203, the identified location may be correlated to any location on carrier substrate 207 through the known distances between camera 303, reference pin 302, and the correlated-to location. Likewise, provided that distances between the identified location, reference pin 301 on micro pick up array 203, and other locations on micro pick up array 203 are known, any location on micro pick up array 203 may be similarly correlated to any location on carrier substrate 207. Performing this correlation may be known as establishing a relational datum.

After establishing the relational datum, alignment between any location on micro pick up array 203 and any location on carrier substrate 207 may be achieved with reasonable accuracy. For example, mass transfer tool 100 may move micro pick up array 203 relative to carrier substrate 207 based on a calculated distance to align corresponding locations. However, the accuracy of the calculated distances and the alignment depends on factors such as manufacturing tolerances of the micro pick up array 203 and carrier substrate 207, and the visual accuracy of camera 303. Thus, establishing the relational datum allows for an approximate, but not necessarily an exact, alignment between micro pick up array 203 and carrier substrate 207 locations. In an embodiment, the approximate alignment is within a tolerance of about 10 µm. Thus, further fine adjustment of the alignment between micro pick up array 203 and carrier substrate 207 may be needed to repeatedly and effectively transfer micro devices 304 from carrier substrate 207 using electrostatic transfer heads 205.

In an embodiment, a micro pick up array alignment encoder provides for fine alignment of micro pick up array 203 with carrier substrate 207. A micro pick up array alignment encoder may include a light source 307, photodetector 308, and corresponding scales. More specifically, encoder scale 305 may overlay corresponding reference scale 306 such that light emitted from light source 307 coupled with micro pick up array holder 110 may pass through a pattern of encoder scale 305 and a pattern of reference scale 306 to photodetector 308 coupled with carrier substrate holder 104. Light detected by photodetector 308 may be processed to accurately determine relative position between micro pick up array 203 and carrier substrate 207. For example, whereas the vision systems described above may allow for alignment between substrates within about 10 µm, fine alignment within about 0.1 µm may be accomplished using embodiments of a micro pick up array alignment encoder. Different types of micro pick up array alignment encoders may be utilized. For example, transmissive-type and reflective-type micro pick up array alignment encoders are described further below.

Figure 4A:
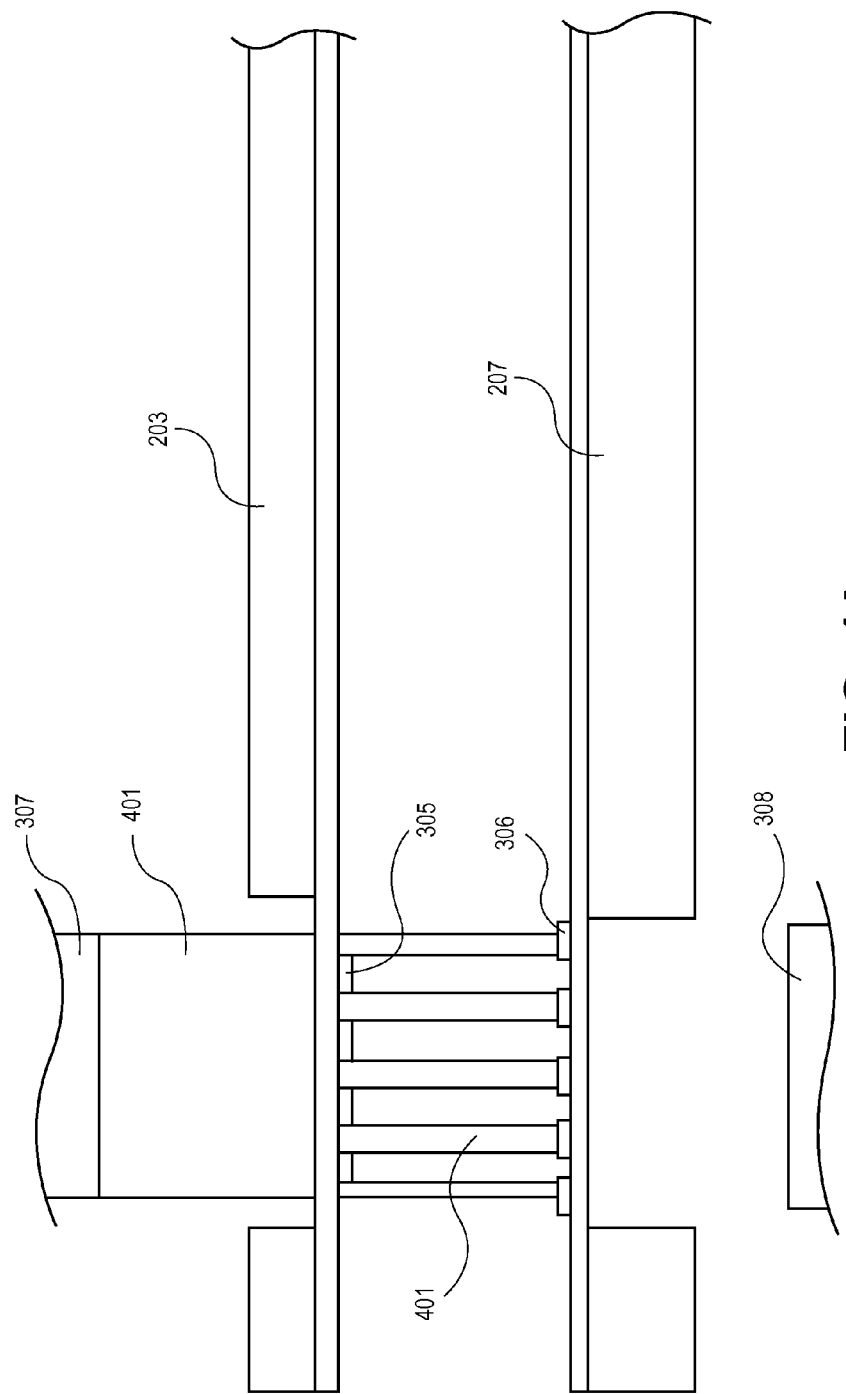
FIG. 4A is a side view of a micro pick up array alignment encoder including a micro pick up array having an encoder scale over a carrier substrate having a transmissive reference scale in a first configuration in accordance with an embodiment of the invention.

Referring to FIG. 4A, a side view of a micro pick up array alignment encoder including a micro pick up array having an encoder scale over a carrier substrate with a transmissive reference scale in a first configuration is shown in accordance with an embodiment of the invention. In the first configuration, light emitted from light source 307 is at least partially blocked from reaching photodetector 308. The embodiment shown in FIG. 4A corresponds with a system arrangement as shown in FIG. 3, in which light is emitted from light source 307 on one side of micro pick up array 203 toward a photodetector 308 on an opposite side of carrier substrate 207. Encoder scale 305 and reference scale 306 are located between light source 307 and photodetector 308, and therefore, the alignment of encoder scale 305 with reference scale 306 determines the amount of light that is transmitted to and received by photodetector 308. More particularly, patterns of encoder scale 305 and reference scale 306 each block emitted light from light source 307 from reaching photodetector 308. Thus, the meshing of the patterns of encoder scale 305 and reference scale 306 influences the transmission of emitted light. For example, each scale may include a grating pattern having a plurality of parallel lines that mesh with parallel lines of the other scale.

Encoder scale 305 may limit transmission of light toward reference scale 306. More particularly, light that impinges on lines of a grating in encoder scale 305 may be blocked. Thus, as emitted light 401 travels through encoder scale 305 in a light beam, total luminance of the light beam decreases. Emitted light 401 traveling past encoder scale 305 will continue toward photodetector 308. However, as it reaches reference scale 306, portions of emitted light 401 may be further blocked and/or reflected by the lines of a grating in reference scale 306. In the embodiment shown in FIG. 4A, the grating of encoder scale 305 and reference scale 306 mesh such that lines of encoder scale 305 fit within gaps of reference scale 306 and vice versa. Thus, any emitted light 401 that passes through encoder scale 305 is reflected or absorbed by reference scale 306. Accordingly, minimal light transmits through reference scale 306 to be received by photodetector 308.

Referring to FIG. 4B, a side view of a micro pick up array alignment encoder including a micro pick up array having an encoder scale over a carrier substrate having a transmissive reference scale in a second configuration is shown in accordance with an embodiment of the invention. In the second configuration, encoder scale 305 and reference scale 306 mesh in a manner such that lines of a grating in reference scale 306 do not fit entirely within gaps of a reference scale 306 grating and vice versa, allowing transmission of light to photodetector 308. More particularly, there is some overlap between gaps in both encoder scale 305 and reference scale 306, and thus, more emitted light 401 will transmit through both encoder scale and reference scale 306 than is shown in FIG. 4A. This transmitted light becomes detected light 403 received by photodetector 308. As explained further below, photodetector 308 may convert detected light 403 into a signal that may be processed to determine whether encoder scale 305 and reference scale 306 are aligned, and thus to determine and facilitate adjustment of relative position between micro pick up array 203 and carrier substrate 207.

Figure 5A:
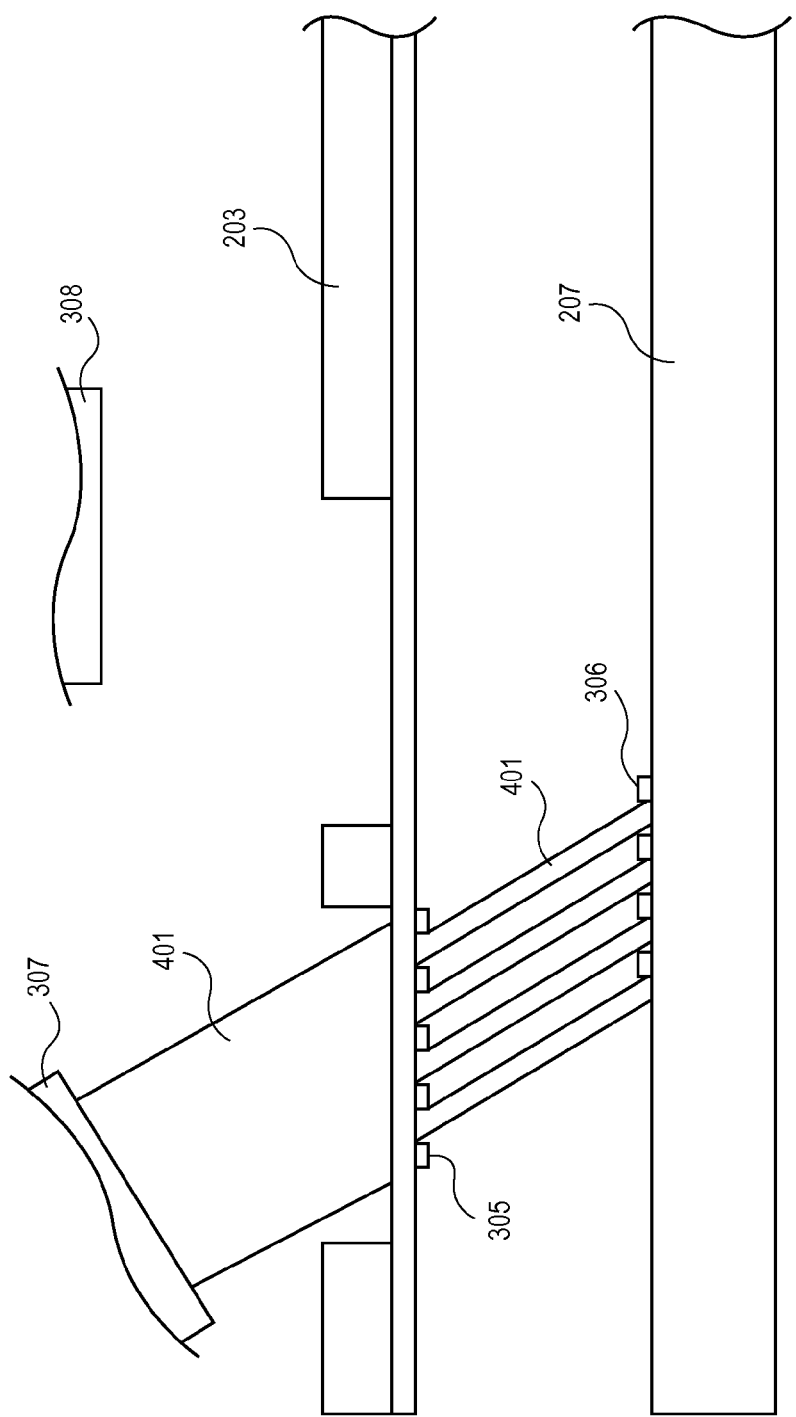
FIG. 5A is a side view of a micro pick up array alignment encoder including a micro pick up array having an encoder scale over a carrier substrate having a reflective reference scale in a first configuration in accordance with an embodiment of the invention.

Referring to FIG. 5A, a side view of a micro pick up array alignment encoder including a micro pick up array having an encoder scale over a carrier substrate having a reflective reference scale in a first blocking configuration is shown in accordance with an embodiment of the invention. The embodiment shown in FIG. 5A differs from the system arrangement shown in FIG. 3. More specifically, in the system arrangement of FIG. 5A, light source 307 and photodetector 308 are located on the same side of carrier substrate 207. Accordingly, photodetector 308 receives light that is reflected from reference scale 306, rather than receiving light that is transmitted through reference scale 306. In an embodiment, emitted light 401 passes through lines of a pattern, e.g., a grating, in encoder scale 305 toward reference scale 306. In the first configuration, lines of encoder scale 305 and reference scale 306 are aligned such that emitted light 401 passing toward reference scale 306 enters gaps between the lines of a grating pattern of reference scale 306, and thus, is absorbed by carrier substrate 207 rather than being reflected from the metallized lines of reference scale 306. Accordingly, minimal emitted light 401 is reflected to or received by photodetector 308.

Figure 5B:
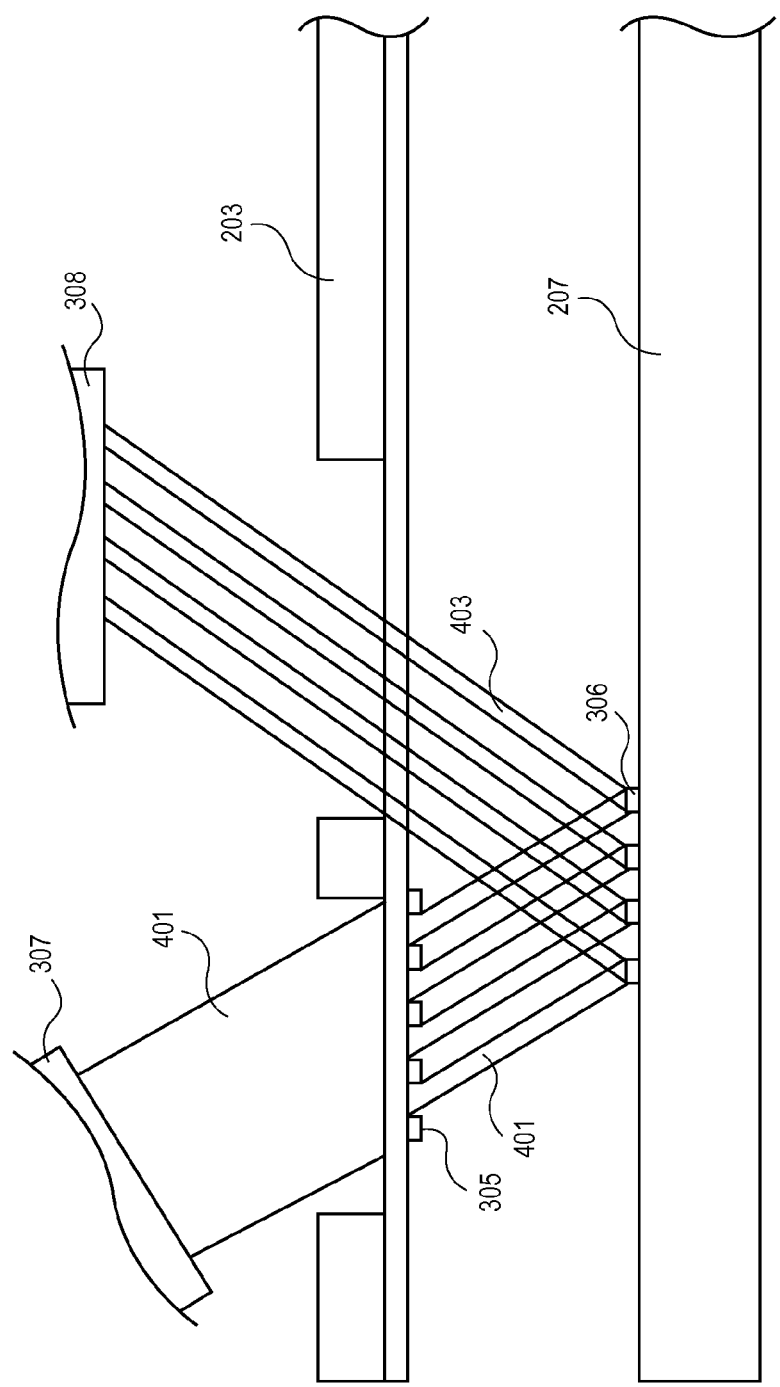
FIG. 5B is a side view of a micro pick up array alignment encoder including a micro pick up array having an encoder scale over a carrier substrate having a reflective reference scale in a second configuration in accordance with an embodiment of the invention.

Referring to FIG. 5B, a side view of a micro pick up array alignment encoder including a micro pick up array having an encoder scale over a carrier substrate having a reflective reference scale in a second transmissive configuration is shown in accordance with an embodiment of the invention. In the second configuration, patterns of encoder scale 305 and reference scale 306 mesh in a manner such that lines of a grating in reference scale 306 fit between line gaps in encoder scale 305 when viewed in the direction of emitted light 401. Thus, the emitted light 401 passing through gaps of encoder scale 305 impinge on and are reflected by the lines of reference scale 306. Accordingly, the reflected light may be relayed toward photodetector 308 through a window formed in micro pick up array 203. The relayed light received by photodetector 308 is detected light 403. As explained further below, photodetector 308 may convert detected light 403 into a signal that may be processed to determine whether encoder scale 305 and reference scale 306 are aligned, and thus to determine a relative position between micro pick up array 203 and carrier substrate 207.

Figure 6:
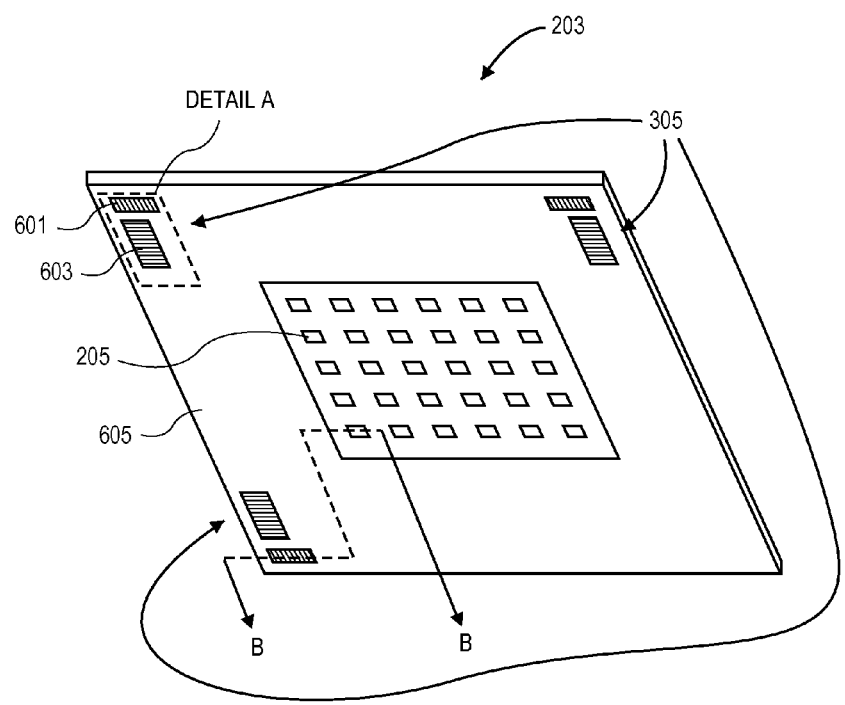
FIG. 6 is a perspective view of a micro pick up array having an encoder scale in accordance with an embodiment of the invention.

Referring to FIG. 6, a perspective view of a micro pick up array having an encoder scale is shown in accordance with an embodiment of the invention. Micro pick up array 203 may include an array of electrostatic transfer heads 205 over a central portion of base substrate 605. One or more encoder scale 305 may be located over base substrate 605 at known distances from electrostatic transfer heads 205. For example, encoder scale 305 shown in Detail A of FIG. 6 may be positioned in a first corner or quadrant of micro pick up array 203 at a known distance from an electrostatic transfer head 205. Accordingly, once the position of encoder scale 305 is identified, the known distance to electrostatic transfer heads 205 may be used to calculate a position of an electrostatic transfer head 205. Similarly, encoder scales 305 may be located in other corners or quadrants of micro pick up array 203, and distances between encoder scales 305 may be known such that identifying the position of one encoder scale 305 may be translated into knowledge of a position of other encoder scales 305.

Each encoder scale 305 on micro pick up array 203 may include a pattern. For example, each encoder scale 305 may include a first grating 601 having a plurality of parallel lines and a second grating 603 having a plurality of parallel lines. In an embodiment, multiple gratings are oriented orthogonally to cause light occlusion and light transmission to vary in different directions. Thus, the multiple gratings may be used to determine position in different directions. This is explained in more detail below.

Figure 7:
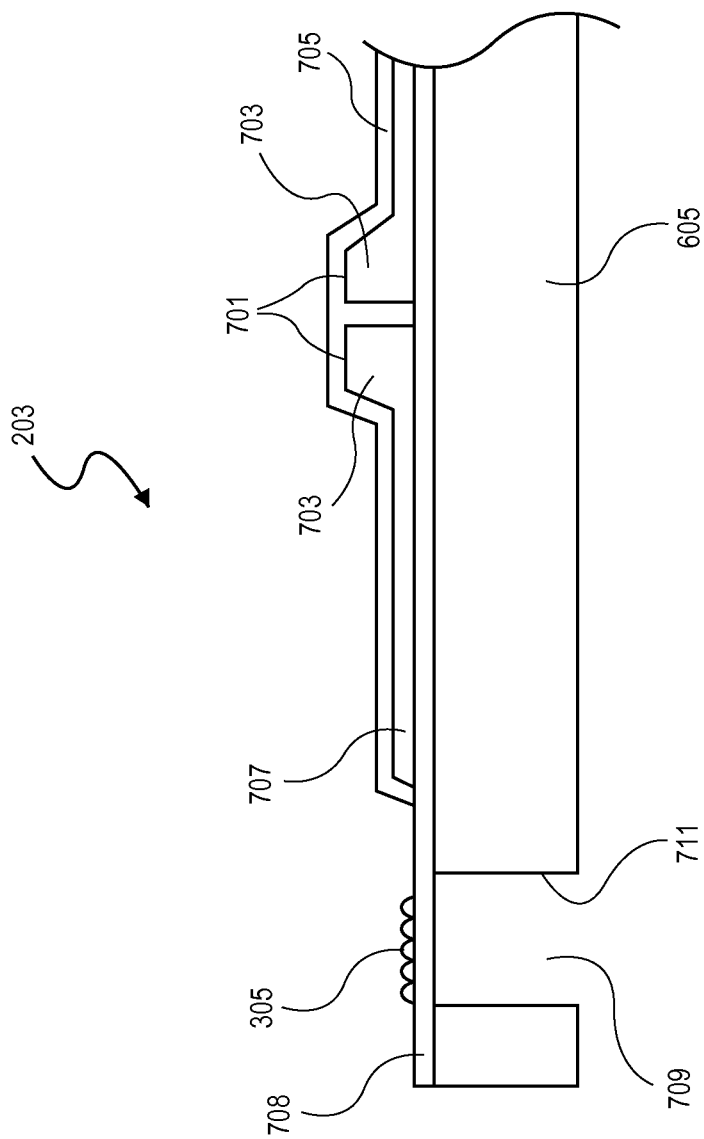
FIG. 7 is a cross-section view of a micro pick array having an encoder scale, taken about section line B-B of FIG. 6, in accordance with an embodiment of the invention.

Referring to FIG. 7, a cross-section view of a micro pick array having an encoder scale, taken about section line B-B of FIG. 6, is shown in accordance with an embodiment of the invention. In an embodiment, the cross-section taken along line B-B corresponds to a portion of micro pick up array 203 that includes a bipolar electrostatic transfer head 205. The embodiment described and illustrated with respect to FIG. 7 is made using a micro pick up array fabricated from a silicon-on-insulator (SOI) wafer, and illustrates one manner for integrating encoder scale 305 with micro pick up array 203. However, embodiments of the invention are not limited to micro pick up arrays fabricated from SOI wafers. The bipolar electrostatic transfer head 205 may be formed from a silicon layer using various etching processes, and may include electrode surfaces 701, both over a top surface of mesa structures 703. A dielectric layer 705 may cover electrode surfaces 701 and may also cover a side surface of mesa structures 703 laterally between the pair of mesa structures 703 for the pair of electrodes in a bipolar electrostatic transfer head 205. Thus, the top surface of dielectric layer 705 over electrode surfaces 701 may be offset from, e.g., above electrode interconnect 707, and provide a raised contact point for pressing against a micro device 304 on a carrier substrate 207. Electrode interconnect 707 may also be formed from the silicon layer and connect with mesa structures 703 to transfer electrostatic voltage from, e.g., a voltage source associated with mass transfer tool 100 to electrode surfaces 701. In addition to electrode interconnect 707 portion overlying oxide layer 708, electrode interconnect 707 may include other portions, such as various traces and vias, that may be integrally formed or separately connected with the electrode interconnect 707 portion shown in FIG. 7. Thus, in an embodiment, electrostatic voltage supplied to electrostatic transfer heads 205 through electrode interconnect 707 generates an electrostatic gripping force on micro devices 304 when electrostatic transfer heads 205 are placed next to micro devices 304.

Oxide layer 708 may support both encoder scale 305 and electrostatic transfer heads 205. The oxide layer 708 may be transparent to emitted light 401, e.g., in a case where emitted light 401 is infrared light. In an embodiment, oxide layer 708 has an overall thickness of approximately 1 μm+/−0.1 μm. Thus, oxide layer 708 may be optically transparent, or at least partially transmissive of, infrared light having wavelengths greater than about 1 μm. Furthermore, oxide layer 708 may be supported by base substrate 605.

A hole 709 may be bored or otherwise formed in base substrate 605. Hole 709 may have a wall profile 711 around an outer perimeter of encoder scale 305 to permit light passing toward oxide layer 708 to transmit freely through base substrate 605. In an embodiment, hole 709 extends entirely through base substrate 605 to oxide layer 708. Wall profile 711 may include an edge that defines a size of hole 709 and the edge may be, for example, at a location where base substrate 605 meets oxide layer 708. In another embodiment, hole 709 is a counterbore and extends through only a portion of base substrate 605 such that a portion of base substrate 605 remains between hole 709 and oxide layer 708. Thus, the edge of wall profile 711 defining a size of hole 709 may be, for example, at a location where the base of the counterbore meets the walls of the counterbore. The depth of hole 709 may depend, for example, on the wavelength of light emitted by light source 307. For example, longer wavelength light may transmit through base substrate 605 more readily, and thus, it may be unnecessary to extend hole 709 fully through base substrate 605. Use of a shallow hole 709 may allow base substrate 605 to be more supportive of oxide layer 708.

In an embodiment, the size of hole 709 defined by the edge of wall profile 711 also defines a window for light emitted by light source 307 to pass through. As described above, the window may surround an outer perimeter of encoder scale 305. Thus, any light passing through encoder scale 305 may also pass through the window. However, this embodiment is not limiting. For example, wall profile 711 may be smaller than a profile of an outer perimeter of encoder scale 305. Thus, some light may be directed toward encoder scale 305 that does not pass through the window of hole 709. In either case, some amount of light may pass toward photodetector 308 to allow photodetector 308 to provide a signal based on the received light.

In an embodiment, a top silicon layer may be located above oxide layer 708. For example, the top silicon layer used to form bipolar electrostatic transfer head 205 may remain over oxide layer 708 following fabrication of the electrostatic transfer heads 205. Thus, encoder scale 305 may be formed directly on the top silicon layer, rather than being formed on oxide layer 708. Consistent with the description above, top silicon layer may be formed in a size that allows for light emitted by light source 307 to at least partially transmit toward photodetector 308. For example, top silicon layer may have an overall thickness of approximately 1 to 5 μm after formation. Thus, top silicon layer may be optically transparent, or at least partially transmissive of, infrared light having wavelengths greater than about 1 μm. Furthermore, top silicon layer may be supported by oxide layer 708 and base substrate 605.

In an embodiment, emitted light 401 is collimated to limit divergence as the emitted light 401 propagates toward photodetector 308. In another embodiment, emitted light 401 provides light with high coherence, either spatial and/or temporal. For example, emitted light 401 may form a laser beam. Thus, the light wave properties may be controlled to ensure that the emitted light 401 is directed through the scales toward the photodetector 308 with minimal divergence to limit noise in a signal that is based on received light, which may otherwise interfere with accurate determination of alignment. In addition, the wavelength of the emitted light 401 can be controlled. For example, in an embodiment, infrared light is used to facilitate propagation of the light through intervening layers of micro pick up array 203 and carrier substrate 207. For instance, emitted light 401 may be infrared light with a wavelength greater than about 1 μm. In an embodiment, oxide layer 708 of micro pick up array 203 and a silicon substrate forming a layer of carrier substrate 207 are optically transparent to this wavelength of light. Therefore, infrared light can transmit directly through micro pick up array 203 and carrier substrate 207 without a need to create holes in the substrates above and/or below the encoder/reference scales.

In an embodiment, the pattern of encoder scale 305 may be metallized on oxide layer 708. For example, encoder scale 305 may include a metallic pattern that is deposited on oxide layer 708 using known processes, such as vacuum metallizing. In an embodiment, the metallized pattern includes metals such as gold, nickel-chrome, aluminum, or molybdenum. However, other metals such as copper, platinum, titanium, chromium titanium, lead, nickel, silver, tin, and tantalum may be used instead.

Alternative manners of forming scale patterns may also be used. For example, in an embodiment, encoder scale pattern may be non-metallic. For example, the pattern may be an ink or polymer printed over oxide layer 708 to form encoder scale 305. Alternatively, scale patterns may be formed by modifying the bulk properties of encoder scale 305, such as by modifying the geometry of oxide layer 708. For example, in an embodiment, oxide layer 708 includes a pattern of lines separated by gaps. The lines and gaps may be formed by etching alternating rows of different depths into oxide layer 708. The alternating rows may include, e.g., lines that are etched to a depth, which are separated by gaps that are not etched and remain at the original oxide layer 708 height. By virtue of the different depths of lines and gaps, light may transmit differently through oxide layer 708 and the difference may be detected and analyzed. The embodiment may incorporate techniques used to create phase-shift masks. Accordingly, encoder scale 305 pattern may also include an attenuated phase-shift mask having a pattern of attenuating material, such as molybdenum silicon, coated on oxide layer 708.

Figure 8:
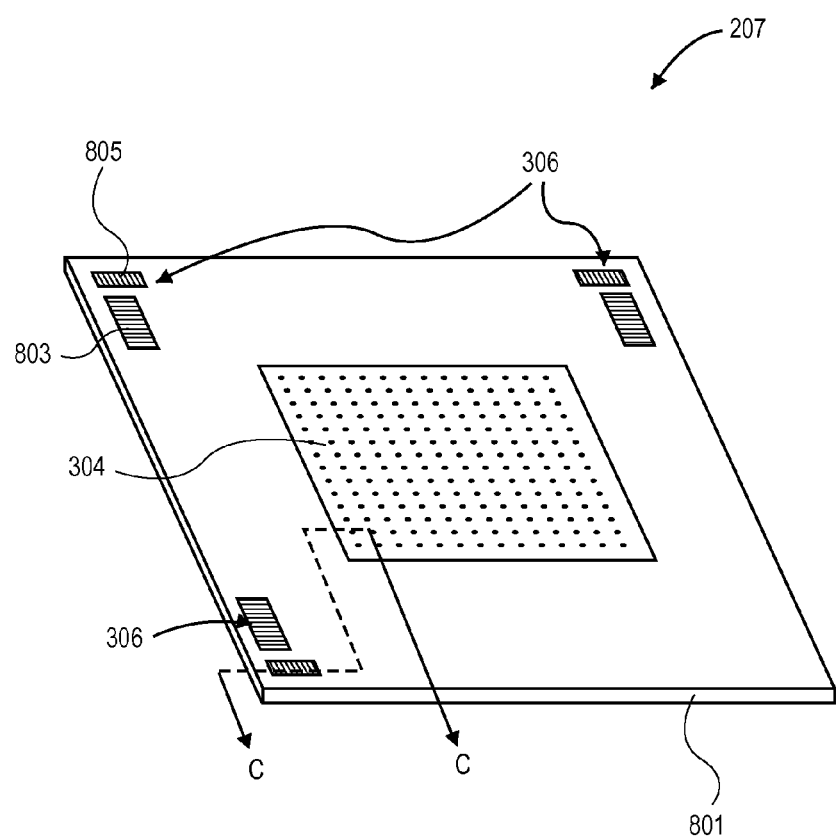
FIG. 8 is a perspective view of a carrier substrate having a reference scale in accordance with an embodiment of the invention.

Referring to FIG. 8 a perspective view of a carrier substrate having a reference scale is shown in accordance with an embodiment of the invention. Carrier substrate 207 may include an array of micro devices 304 over a central portion of base substrate 801. One or more reference scale 306 may be located over base substrate 801 at known distances from micro devices 304. For example, reference scale 306 intersected by section line C-C of FIG. 8 may be positioned in a first corner or quadrant of micro pick up array 203 at a known distance from a micro device 304. Accordingly, once a position of reference scale 306 is identified, a position of a micro device 304 may be calculated based on relative parameters of the positions. Similarly, reference scales may be located in other corners or quadrants of carrier substrate 207, and distances between reference scales 306 may be known such that identifying the position of one reference scale 306 may be translated into knowledge of a position of other reference scales.

As with encoder scales of FIG. 6, reference scales 306 of FIG. 8 may include patterns. For example, each reference scale 306 may include a plurality of gratings, e.g., 803, 805, that are orthogonally oriented and offset relative to each other. The gratings of reference scales 306 may mesh with corresponding gratings of encoder scales 305 to be used to determine relative position between micro pick up array 203 and carrier substrate 207, as explained in more detail below. Determination of relative position may be used to adjust alignment of micro pick up array 203 and carrier substrate 207.

Figure 9:
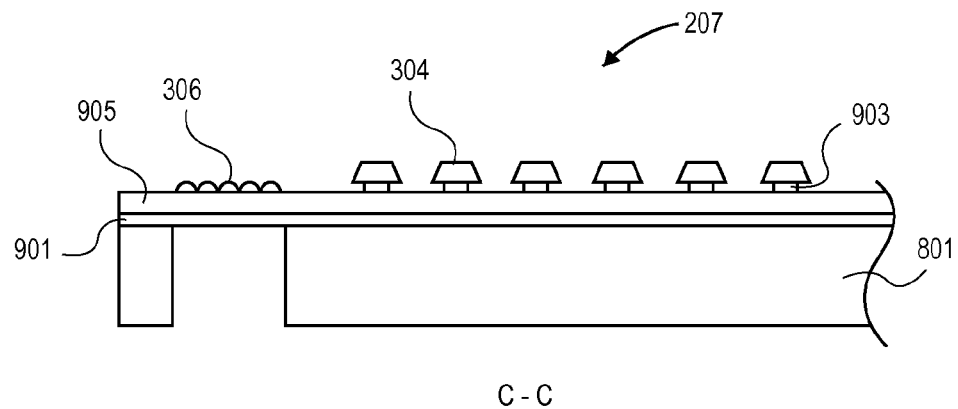
FIG. 9 is a cross-section view of a carrier substrate having a reference scale, taken about section line C-C of FIG. 8, in accordance with an embodiment of the invention.

Referring to FIG. 9, a cross-section view of a carrier substrate having a reference scale, taken about section line C-C of FIG. 8, is shown in accordance with an embodiment of the invention. Carrier substrate 207 may include a base substrate 801. Base substrate 801 may, for example, be formed from silicon. However, base substrate 801 may also be formed from other materials. In an embodiment, carrier substrate 207 does not include base substrate 801. For example, in an embodiment, a stabilization layer 905 may be suitably strong to support a reference scale and electrostatic transfer heads, as described below. Adhesion layer 901 may be used to increase adhesion between base substrate 801 and stabilization layer 905. More specifically, adhesion layer 901 may be AP3000, available from the Dow Chemical Company. Such an adhesion layer material may be particularly suitable in a case where stabilization layer 905 is formed from benzocyclobutene (BCB). However, stabilization layer 905 may be formed from non-BCB materials, such as an epoxy. Stabilization layer 905 provides an adhesive bonding material for conductive contacts 903 of micro devices 304. Conductive contacts 903 may be formed over an underside of micro devices 304 through suitable techniques, such as sputtering or electron beam deposition followed by etching or liftoff, and may have several layers with an overall thickness of about 0.1 to 2 μm. Micro devices 304 may include, e.g., micro LED devices formed from an active device layer having an n-doped layer, one or more quantum well layers, and a p-doped layer. An overall thickness of the device layer may be between about 1 to 20 μm. Where the micro LED devices are designed to emit a red light (e.g. 620-750 nm wavelength) the device layer may include a material such as aluminum gallium arsenide (AlGaAs), gallium arsenide phosphide (GaAsP), aluminum gallium indium phosphide (AlGaInP), and gallium phosphide (GaP). Where the micro LED devices are designed to emit a green light (e.g. 495-570 nm wavelength) the device layer may include a material such as indium gallium nitride (InGaN), gallium nitride (GaN), gallium phosphide (GaP), aluminum gallium indium phosphide (AlGaInP), and aluminum gallium phosphide (AlGaP). Where the micro LED devices are designed to emit a blue light (e.g. 450-495 nm wavelength) the device layer may include a material such as gallium nitride (GaN), indium gallium nitride (InGaN), and zinc selenide (ZnSe).

In addition to the basic structure of carrier substrate 207, one or more reference scale 306 may also be formed over stabilization layer 905. In an embodiment, reference scale 306 pattern may be metallized on stabilization layer 905. For example, reference scale 306 may include a metallic grating with parallel lines that are deposited on stabilization layer 905 using known processes, such as vacuum metallizing. In an embodiment, reference scale 306 includes metals such as gold, nickel-chrome, aluminum, or molybdenum. However, other metals such as copper, platinum, titanium, chromium titanium, lead, nickel, silver, tin, and tantalum may be used instead. In an alternative embodiment, reference scale 306 pattern is non-metallic. For example, the pattern may be an ink or polymer printed over stabilization layer 905 to form reference scale 306.

Stabilization layer 905 may be transparent to the emitted light 401, e.g., in a case where emitted light 401 is infrared light. Stabilization layer 905 may also be transparent to the visible spectrum of light in emitted light 401. Furthermore, embodiments of adhesive layers of carrier substrate 207, such as adhesion layer 901 formed from BCB, may also be transparent to both the infrared and visible spectrums of light. Base substrate 801 may optionally include a hole 709 under reference scale 306 to permit emitted light 401 to transmit through stabilization layer 905 and transmit freely through base substrate 801. In an embodiment, hole 709 extends through only a portion of base substrate 801 such that a portion of base substrate 801 remains between hole 709 and adhesion layer 901. In another embodiment, hole 709 extends entirely through base substrate 801 to adhesion layer 901. The depth of hole 709 may depend, for example, on the wavelength of light emitted by light source 307. For example, longer wavelength light may transmit through base substrate 801 more readily, and thus, it may be unnecessary to extend hole 709 fully through base substrate 801. Furthermore, a shallow hole 709 may allow base substrate 801 to be more supportive of oxide layer 708.

Figure 10:
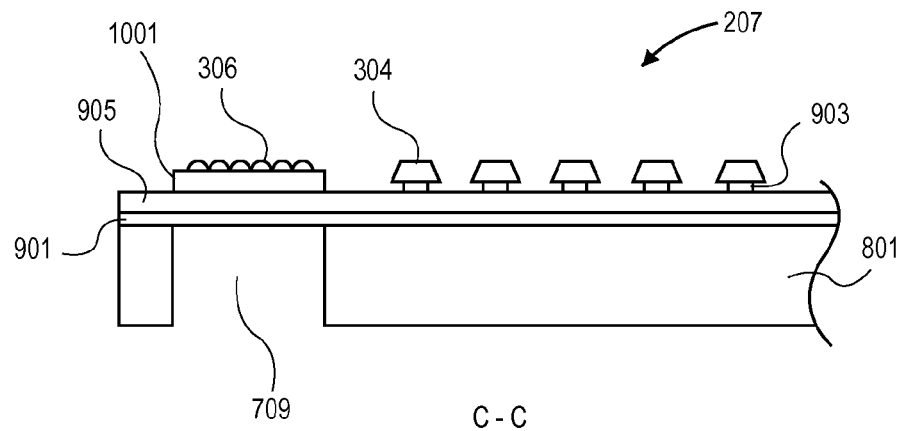
FIG. 10 is a cross-section view of a carrier substrate having a reference scale, taken about section line C-C of FIG. 8, in accordance with an embodiment of the invention.

Referring to FIG. 10, a cross-section view of a carrier substrate having a reference scale, taken about section line C-C of FIG. 8, is shown in accordance with an embodiment of the invention. The basic structure of carrier substrate 207 may be similar to that described above with respect to FIG. 9. Additionally, carrier substrate 207 optionally includes hole 709 depending on the properties of the emitted light 401 as described above. However, carrier substrate 207 may include a deposition layer 1001 sandwiched between reference scale 306 and stabilization layer 905. More particularly, reference scale 306 may be applied over deposition layer 1001 using, e.g., metallization or printing processes. In an embodiment, deposition layer 1001 may be formed from the same material as device layer used to form micro devices 304. Deposition layer 1001 profile supporting reference scale 306 may be formed using processes similar to those used to form micro devices 304, e.g., various etching processes.

Figure 11:
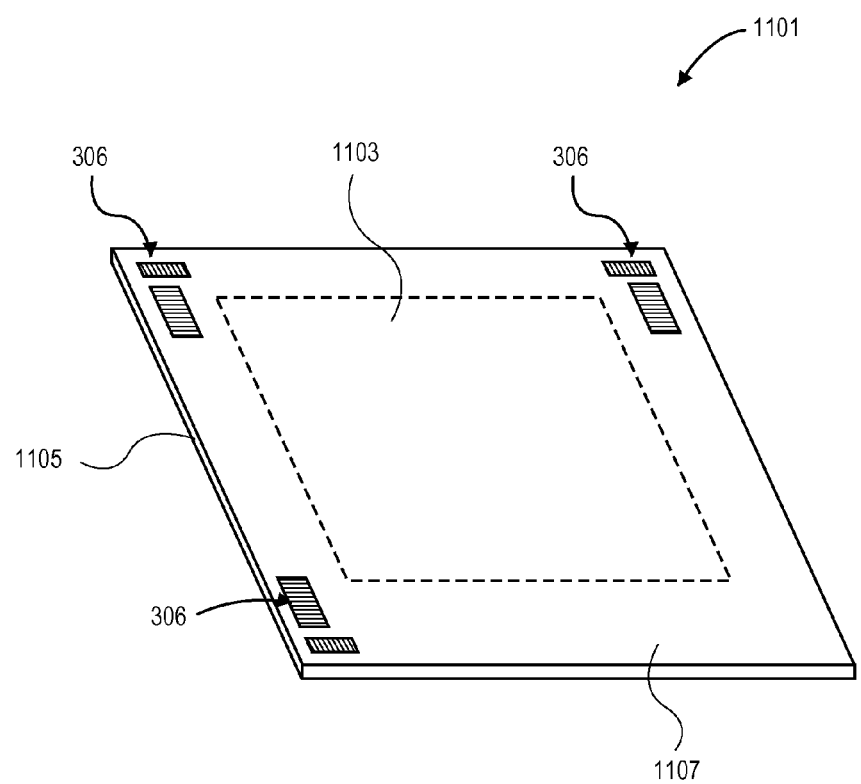
FIG. 11 is a perspective view of a receiving substrate having a reference scale in accordance with an embodiment of the invention.

Referring to FIG. 11, a perspective view of a receiving substrate having a reference scale is shown in accordance with an embodiment of the invention. Receiving substrate 1101 may be a lighting substrate. For example, receiving substrate 1101 may be a transparent, opaque, rigid, or flexible light substrate. In an embodiment, receiving substrate includes a display panel having a display substrate. For example, in one application, the display substrate may be a thin-film transistor (TFT) substrate 1105. However, the example is not limiting. Receiving substrate 1101 may further include a pixel area 1103 over a central portion of TFT substrate 1105. In an embodiment, the pixel area 1103 includes an array of subpixels for receiving micro LED devices from the carrier substrate 207 described above. More specifically, micro devices 304 may be transferred from carrier substrate 207 to pixel area 1103 of TFT substrate 1105 to form the array of subpixels.

One or more reference scale 306 may be located over non-pixel area 1107 along the periphery of TFT substrate 1105 at known distances from subpixel locations. For example, reference scales 306 may be positioned in separated corners or quadrants of TFT substrate 1105 at a known distance from a pixel in pixel area 1103. Accordingly, identifying the position of a reference scale 306 may be translated into identification of a position of a pixel. Similarly, identifying the position of one reference scale 306 may be translated into knowledge of a position of other reference scales 306.

As with reference scale 306 of FIG. 8, reference scale 306 of FIG. 11 may be patterned. For example, each reference scale 306 may include a plurality of gratings that are orthogonally oriented to facilitate determining a relative position between micro pick up array 203 and receiving substrate 1101 in different directions. More specifically, the gratings of reference scale 306 may mesh with corresponding gratings of encoder scale 305 of micro pick up array 203 and that meshing may be analyzed to determine relative position between micro pick up array 203 and receiving substrate 1101.

As explained above, meshing scales can be used to determine relative position between micro pick up array 203 and a target substrate. The determination may be based on detection of transmitted light, which will increase or decrease depending on the light occlusion created between the patterns of the meshing scales. There are numerous patterns that may be used to mesh in a manner that varies with position. More specifically, numerous individual patterns, when overlaid, will transmit light differently as the patterns move relative to each other. The discussion below provides several non-limiting examples of patterns that may be used in a micro pick up array alignment encoder.

Figure 12:
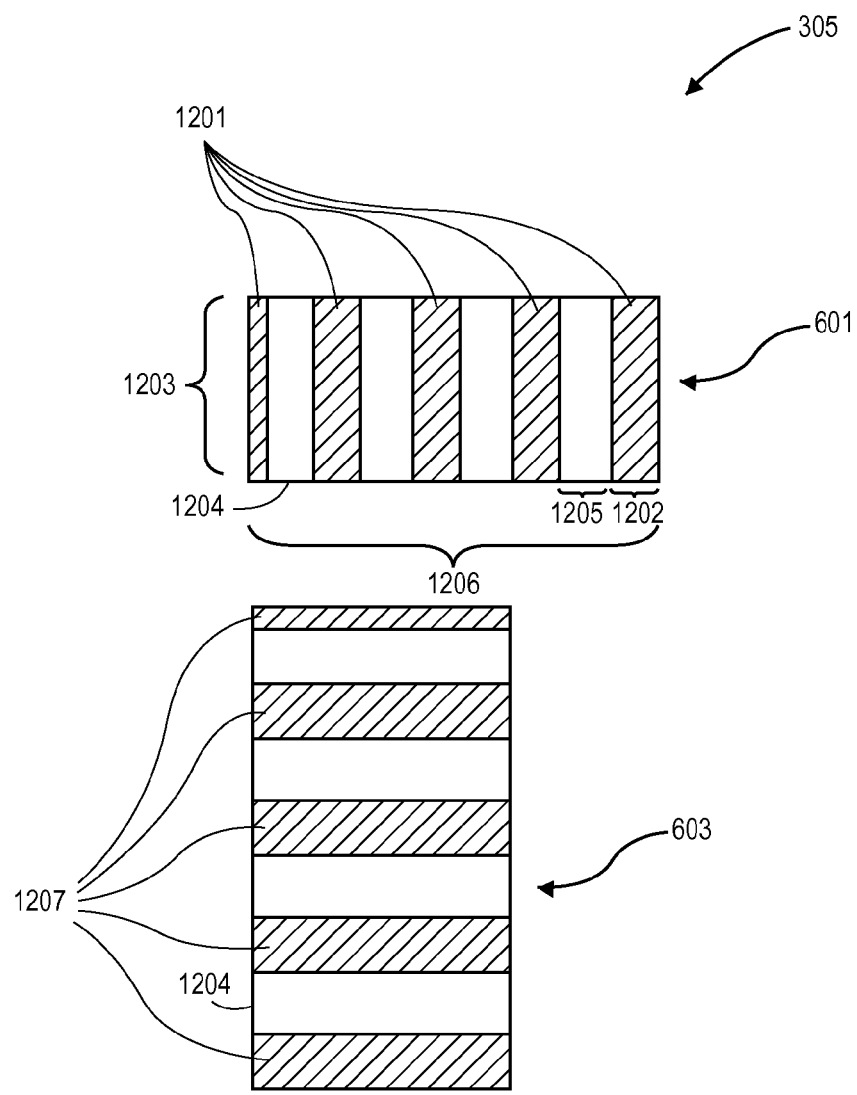
FIG. 12 is a pictorial view of an encoder scale having a plurality of gratings orthogonally arranged relative to each other, taken from Detail A of FIG. 6, in accordance with an embodiment of the invention.

Referring to FIG. 12, a pictorial view of an encoder scale having a plurality of gratings orthogonally arranged relative to each other, taken from Detail A of FIG. 6, is shown in accordance with an embodiment of the invention. As discussed above, the pattern of encoder scale 305 on micro pick up array 203 may be similar to the pattern of reference scale 306 on the target substrate, such as carrier substrate 207 or receiving substrate 1101. Thus, the following description may apply to both encoder scale 305 and reference scale 306, although the specific pattern of each may vary to permit the patterns to mesh with each other.

In an embodiment, encoder scale 305 includes a first grating 601 having a plurality of first parallel lines 1201. Each line in the parallel lines may include a line length and a line width 1202. The line length may equal a grating width 1203 of an outer perimeter 1204. A gap 1205 may separate each line from an adjacent line. Another side of outer perimeter 1204, i.e., a grating length 1206, may be defined by the sum of line widths 1202 for all of the parallel lines, as well as the sum of gap 1205 distances between the lines. In an embodiment, the line width 1202 is between about 1 to 5 µm. More particularly, the line width 1202 may be about 2 µm. In an embodiment, the gap 1205 distance equals the line width 1202, i.e., the gap 1205 between the lines in the gratings may also be approximately 2 µm. As a result, in a case of a transmissive-type micro pick up array alignment encoder, when the lines of the encoder and reference gratings are aligned, i.e., when encoder lines are directly over reference lines, maximum light will pass through the encoder scale 305 and the reference scale 306 grating. Alternatively, when the lines of the gratings are offset by the line width 1202, minimum light will pass, since any light passing through the gap 1205 in encoder scale 305 is likely to be reflected or absorbed by the lines in reference scale 306. This example is provided to illustrate a manner in which encoder scale 305 and reference scale 306 mesh to affect transmission of incoming light, but additional embodiments, such as the reflective-type micro pick up array alignment encoder described above, will make clear that the example is not limiting.

In an embodiment, encoder scale 305 includes second grating 603 having second parallel lines 1207. As with first grating 601, each line of second parallel lines 1207 may include a line width 1202 and be spaced apart from the other lines by a gap 1205 distance. In an embodiment, line width and gap distance of encoder gratings correspond to a gap distance and line width of a counterpart grating of reference scale 306 to affect transmission of incoming light. Consequently, light transmission through second grating 603 will be affected by movement in a direction orthogonal to the direction of movement that affects light transmission through first grating 601.

Figure 13:
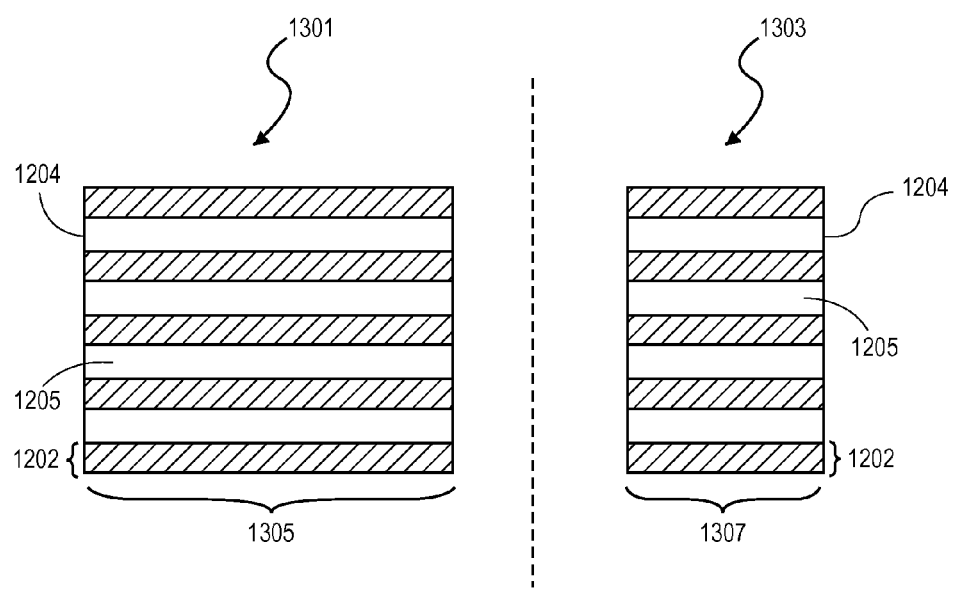
FIG. 13 is a pictorial view of an encoder scale and reference scale combination of a micro pick up array alignment encoder in accordance with an embodiment of the invention.

Referring to FIG. 13, a pictorial view of an encoder scale and reference scale combination of a micro pick up array alignment encoder is shown in accordance with an embodiment of the invention. The illustrated combination includes an encoder grating 1301 and a reference grating 1303, each shown on opposite sides of a dotted line. The gratings may be one of a plurality of gratings in encoder scale 305 or reference scale 306, such as first grating 601 or second grating 603 shown in FIG. 12. The dotted line is provided as a separator between the gratings, but the view is pictorial and thus the dotted line bears no structural significance in the context of the micro pick up array alignment encoder. Encoder grating 1301 includes several parallel lines, each of which includes a line width 1202 and is separated from other lines by a gap 1205, as discussed above. Taken together, line width 1202 and a distance of gap 1205 may be referred to as a pitch of a grating. Similarly, reference grating 1303 also includes several parallel lines having line widths and gap 1205 separations. As above, the gap 1205 of reference grating 1303 may correspond to the line width 1202 of encoder grating 1301 such that emitted light 401 is transmitted or reflected based on the alignment of encoder grating 1301 and reference grating 1303. Thus, in an embodiment, a pitch of encoder grating 1301 is equal to a pitch of reference grating 1303.

In an embodiment, emitted light 401 may only be able to transmit through gap 1205 of encoder grating 1301 and reference grating 1303 when the gratings overlap. More particularly, the encoder grating 1301 may have an outer perimeter 1204 that demarcates a window through which light may pass. Outside of outer perimeter 1204 may be material that prevents light transmission, and thus, outer perimeter 1204 effectively defines a window for light transmission. As such, light passing through gap 1205 of encoder grating 1301 will only be able to pass through gap 1205 of reference grating 1303 when the outer perimeters 1204 of encoder grating 1301 and reference grating 1303 coincide. Therefore, in the embodiment shown in FIG. 13, when encoder grating 1301 overlays reference grating 1303, as long as the lateral margins of reference grating 1303 remain within the lateral margins of encoder grating 1301, the light received by photodetector 308 may be expected to only change when reference grating 1303 moves in a direction orthogonal to parallel lines of encoder grating 1301. Relative movement in the direction of parallel lines will not affect light transmission because it will not change the light occlusion created between grating profiles.

As described above, encoder grating 1301 may be adjacent to another encoder grating, and the parallel lines of the adjacent encoder gratings may be orthogonally arranged relative to each other. Reference scale 306 may likewise have adjacent reference gratings 1303 with orthogonally arranged lines. Therefore, encoder scale 305 and reference scale 306 may include at least one matching pair of grating profiles that move between alignment and misalignment as the scales are moved in one direction, and another matching pair of grating profiles that move between alignment and misalignment as the scales are moved in a second, orthogonal, direction. However, light transmission through the first matching pair of grating profiles will only remain unaffected by movement in the second direction as long as the outer perimeters 1204 of the grating profiles remain nested. As one outer perimeter 1204 moves outside of the other, and the outer perimeters intersect, the outer perimeters will no longer be nested and light transmitting through one grating will be blocked by the substrate surrounding the other grating. To avoid this effect, in an embodiment, encoder grating 1301 in the first pair is wider than the corresponding reference grating 1303 in the first pair by at least the same distance as is required to move in the second direction to determine alignment of the second pair. For example, encoder grating width 1305 may be twice as long as reference grating width 1307. In other words, encoder gratings and reference gratings in each matching pair may be sized such that a matching pair of gratings may be aligned without causing a change in light transmission through an adjacent matching pair of gratings.

Figure 14:
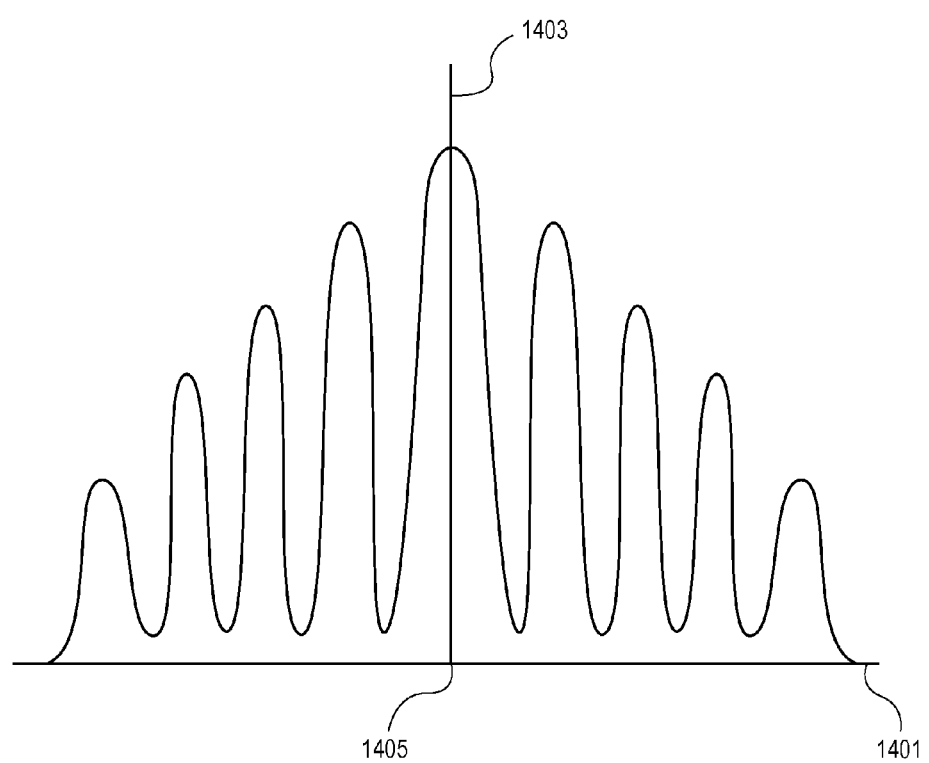
FIG. 14 is a graphical view of detected light plotted against relative position between an encoder scale and a reference scale of a micro pick up array alignment encoder in accordance with an embodiment of the invention.

Referring to FIG. 14, a graphical view of detected light plotted against relative position between an encoder scale and a reference scale of a micro pick up array alignment encoder is shown in accordance with an embodiment of the invention. The graph includes a position domain 1401 on the x-axis plotted against a detected light domain 1403 on the y-axis. Magnitude of the signal in the detected light domain 1403 corresponds to detected light 403 received by photodetector 308. For example, the maximum amplitude in the detected light domain 1403 may occur at the aligned position 1405 at which the patterns of encoder scale 305 and reference scale 306 mesh such that maximum light transmits or reflects toward photodetector 308. More particularly, the signal shown at aligned position 1405 corresponds with a configuration similar to that illustrated in FIG. 4B or FIG. 5B, depending on whether the system arrangement is transmissive or reflective. The signal may be, for example, an electrical signal generated by photodetector 308 by converting light energy into electrical energy. Accordingly, the signal may be an electrical voltage or current generated by photodetector 308 in response to received light.

In an embodiment in which encoder scale 305 and reference scale 306 have grating patterns with approximately equal grating lengths 1206, as either scale is moved relative to the other in a direction orthogonal to parallel lines, the received light will oscillate between a local minima of illuminance, corresponding to a configuration similar to that illustrated in FIG. 4A or FIG. 5A, and a local maxima of illuminance, corresponding to a configuration similar to that illustrated in FIG. 4B or FIG. 5B. Each maxima will decrease moving away from the aligned position 1405 as the coinciding areas of encoder and reference scale outer perimeters 1204 decreases. Thus, by analyzing a detected light versus position plot, aligned position 1405 for a corresponding encoder/reference scale pair can be determined by identifying the maximum signal for all sampled positions. In an embodiment, this signal may be an analog output from photodetector 308. The determined alignment position may be used to represent a local datum coordinate between micro pick up array 203 and carrier substrate 207 in a single direction. By processing and analyzing received light versus direction for an adjacent encoder/reference scale pair, an aligned position 1405 may be determined in a direction orthogonal to the direction observed for the first pair. Accordingly, a second local datum coordinate may be determined. By combining the first and second datum coordinates, a reference location between micro pick up array 203 and carrier substrate 207 may be established. The reference location represents a configuration at which encoder/reference scale pair aligns and corresponds to a known relative position between micro pick up array 203 and carrier substrate 207 within a tolerance of less than a grating line width 1202, e.g., less than about 2 µm. This tolerance may be decreased by using narrower grating line widths. Furthermore, the tolerance may be decreased using increased signal sampling resolution, as described below.

In an embodiment, the tolerance for alignment between a pair of encoder/reference scales need not be limited by and related only to the line width and/or grating pitch, but may also use techniques such as digital processing of the transmission intensity signal from photodetector 308 to further decrease tolerances. Digital interpolation of the transmission signal may be utilized after a coarse alignment has been achieved, e.g., based on analog signal processing, in the manner described above with reference to FIG. 14. For example, once aligned position 1405 is determined by identifying a maximum signal of illuminance, the known distances between adjacent local maxima may then be digitally interpolated to determine aligned position 1405 with even high measurement resolution. Digital interpolation may effectively sub-divide the distance between local maxima to a tolerance equal to 1/Nth of the known distance between adjacent maxima, where N is a number of discrete values of transmitted light intensity discernible by the photodetector and its associated circuitry. A known distance between maxima may be assumed to correspond to a distance that a line of encoder scale 305 moves between a position of alignment with a line of reference scale 306 and a position of alignment with an adjacent line of reference scale 306, e.g., a grating pitch. Thus, in an embodiment in which a grating pitch of 4 µm is used, corresponding to a line width of 2 µm and a gap distance of 2 µm, along with a photodetector having 12-bit sampling to record 4096 discrete levels of a grayscale value, digital interpolation may be used to find aligned position 1405 within a resolution of about 1 nm. Accordingly, an iterative approach incorporating analog and digital techniques may be used to achieve alignment between electrostatic transfer heads and micro devices.

After establishing a reference location using one pair of encoder and reference scales, another reference location may be determined at another pair of encoder and reference scales using a similar manner of alignment. That is, detected light 403 for adjacent encoder/reference scales may be plotted against position to determine signal maxima representing local datums in multiple directions. When combined, these datums define a second reference location. This process may be repeated for each pair of encoder/reference scales, such as those located in different quadrants or corners of micro pick up array 203, as shown in FIG. 6.

The determination of multiple reference locations may be used to determine an angular alignment between micro pick up array 203 and a target substrate. Although various referencing features such as reference pins may be used, some angular misalignment may remain between micro pick up array 203 and carrier substrate 207. Angular misalignment may be calculated using the distances that micro pick up array 203 must be moved from a first reference location relative to carrier substrate 207 in order to detect a second reference location. For example, if the expected distance between a first reference location on carrier substrate 207 and a second reference location on carrier substrate 207 is 100 units in an x-direction and 0 units in a y-direction, but the micro pick up array 203 is moved 4 units in the y-direction to identify the second reference location, then the angular misalignment may be calculated as the inverse sine of 4 units over 100 units, providing an estimated angular misalignment of just over 2 degrees between micro pick up array 203 and carrier substrate 207.

Once angular misalignment is estimated, actuators of mass transfer tool 100 may be used to rotate micro pick up array 203 into alignment with the carrier substrate 207. The alignment process may be repeated by re-evaluating the reference locations and re-calculating angular misalignment in an iterative process until angular alignment between micro pick up array 203 and the carrier substrate 207 is estimated to be within a predetermined tolerance.

After micro pick up array 203 is rotationally aligned with carrier substrate 207, distances between points on micro pick up array 203 and carrier substrate 207 may be calculated as well. The determined reference locations can be used as datums from which distances are estimated. For example, based on a known distance between the reference location and an electrostatic transfer head 205, as well as a known distance between a reference location and a micro device 304, the relative distance between the electrostatic transfer head 205 and the micro device 304 can be calculated. Mass transfer tool 100 may use the calculated distance to move electrostatic transfer head 205 into alignment with micro devices 304 to ensure effective contact and pickup of micro devices 304 during a transfer process.

Figure 15:
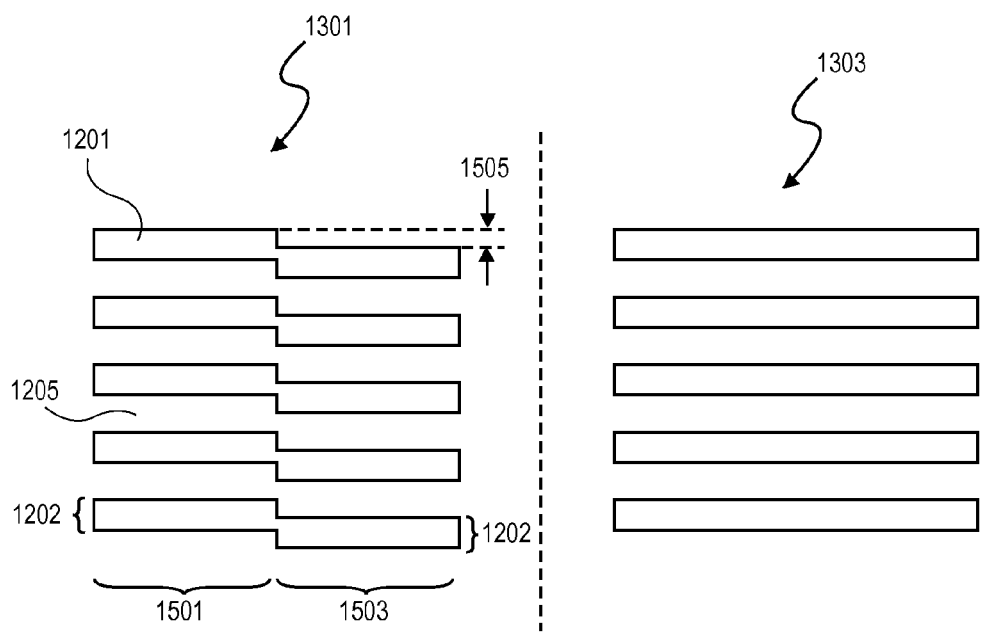
FIG. 15 is a pictorial view of an alternative encoder scale and reference scale combination of a micro pick up array alignment encoder in accordance with an embodiment of the invention.

Referring to FIG. 15, a pictorial view of an alternative encoder scale and reference scale combination of a micro pick up array alignment encoder is shown in accordance with an embodiment of the invention. The encoder grating 1301 and reference grating 1303 embodiments may replace one or both gratings of encoder scale 305 and reference scale 306 shown in FIG. 12. More generally, the encoder scale 305 and reference scale 306 described herein may be interchanged while still allowing alignment between micro pick up array 203 and a target substrate to be determined.

Encoder grating 1301 may include parallel lines that are divided into first column 1501 and second column 1503. Parallel lines of first column 1501 and second column 1503 may be shifted relative to each other by an offset 1505. Thus, first column 1501 and second column 1503 may include similar or identical line widths 1202 separated by similar or identical gap 1205, and the respective line width 1202 of first column 1501 may overlay the respective line width 1202 of second column 1503. More specifically, offset 1505 distance may be less than line width 1202 such that a single line remains continuous across first column 1501 and second column 1503, albeit in a jagged or stepped shape. In an embodiment, offset 1505 distance may be approximately half of line width 1202. As described below, such an offset 1505 may result in a phase shift in detected light 403 signal when comparing light passing through first column 1501 with light passing through second column 1503. Given that the multi-column encoder scale pattern may result in differing detected signals, the encoder grating 1301 may be referred to as a dual-channel grating, in which a signal based on light from first column 1501 is an "A" channel and a signal based on light from second column 1503 is a "B" channel.

In an embodiment having dual-channel encoder grating 1301, reference grating 1303 may include parallel lines in a single column without an offset 1505. Accordingly, as encoder grating 1301 with offset parallel lines is moved over reference grating 1303 without offset lines, light passing through first column 1501 will transmit through or reflect from the parallel lines of reference grating 1303 differently than light passing through second column 1503. In an embodiment, multiple photodetectors 308 may be used to detect this difference in illuminance. For example, a first photodetector 308 may be located to receive light passing through first column 1501, and a second photodetector 308 may be located to receive light passing through second column 1503. Comparison of signals based on the different received light may be used to determine alignment between encoder scale 305 and reference scale 306.

Figure 16:
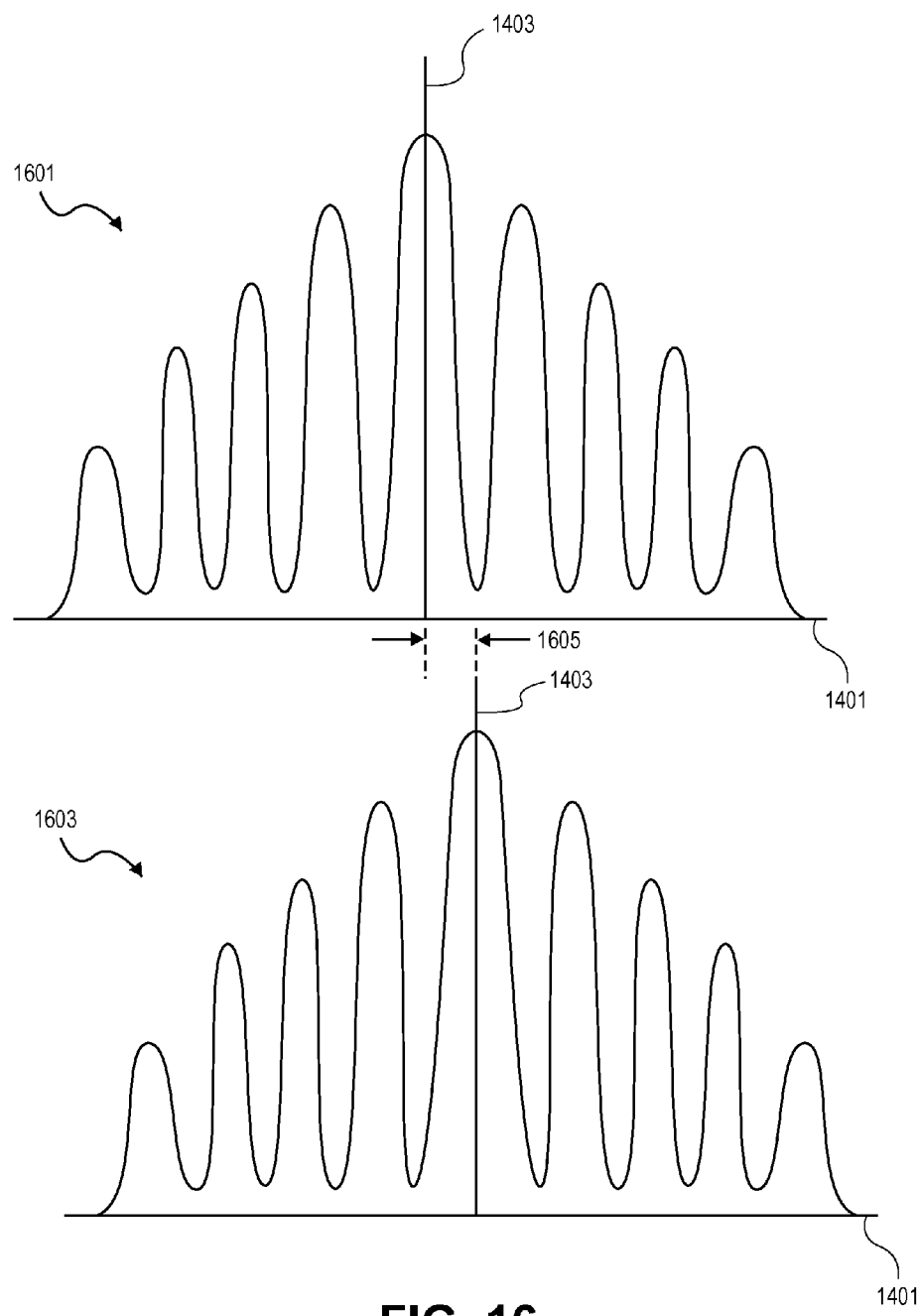
FIG. 16 is a graphical view of a plurality of graphs plotting detected light against relative position between an encoder scale and a reference scale of a micro pick up array alignment encoder in accordance with an embodiment of the invention.

Referring to FIG. 16, a graphical view of a plurality of graphs plotting detected light against relative position between an encoder scale and a reference scale of a micro pick up array alignment encoder is shown in accordance with an embodiment of the invention. The upper graph of FIG. 16 corresponds to a first column signal 1601, i.e., an A channel, corresponding to light passing through first column 1501 of encoder grating 1301 and the lower graph corresponds to a second column signal 1603, i.e., a B channel, corresponding to light passing through second column 1503 of encoder grating 1301. As in the embodiment described with respect to FIG. 14, each light signal will vary between maxima and minima as the parallel lines of encoder grating 1301 and reference grating 1303 move between positions of misalignment and alignment. The maximum light signal from each graph corresponds with an alignment position for the respective column of encoder grating 1301. For example, first column 1501 of encoder grating 1301 may have a maximum light signal that differs in position from a maximum light signal of second column 1503 of encoder grating 1301 by a phase shift 1605. The phase shift 1605 may correlate closely with offset 1505 between parallel lines of first column 1501 and second column 1503. For example, in the case where encoder grating and reference grating are angularly aligned, offset 1505 distance is equal to half of line width 1202 of parallel lines, a phase shift 1605 of approximately 90 degrees will exist between the maximum light signals. Furthermore, phase shift 1605 between maximum signals of first column signal 1601 and second column signal 1603 may correlate with angular alignment between encoder scale 305 and reference scale 306. More particularly, depending on the angular alignment between encoder scale 305 and reference scale 306, phase shift 1605 may vary.

Figure 17:
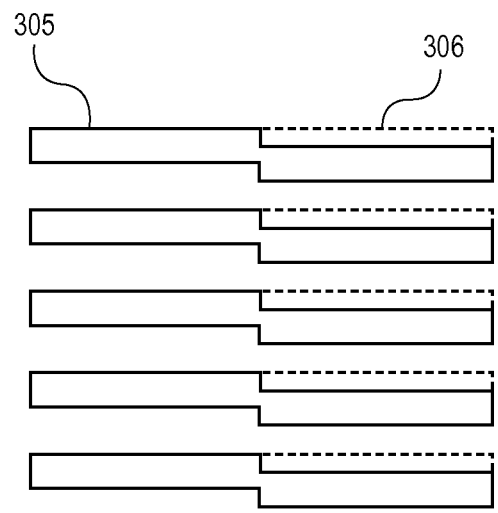
FIG. 17 is a pictorial view of an encoder scale rotationally aligned with a reference scale in accordance with an embodiment of the invention.

Referring to FIG. 17, a pictorial view of an encoder scale rotationally aligned with a reference scale is shown in accordance with an embodiment of the invention. Encoder scale 305 is shown angularly aligned with reference scale 306. Parallel lines of encoder scale 305 are parallel with parallel lines of reference scale 306. Furthermore, in the illustrated arrangement, an upper edge of parallel lines in first column 1501 of encoder scale 305 is aligned with an upper edge of parallel lines of reference scale 306. Therefore, in a case where micro pick up array alignment encoder is of a transmissive type, i.e., where light transmits through both encoder scale 305 and reference scale 306 to photodetector 308, first column signal 1601 would be at a maxima in the illustrated arrangement while second column signal 1603 would be between a maxima and a minima, e.g., at a 90 degree phase shift 1605. Thus, a particular phase shift 1605 would be detected between first column signal 1601 and second column signal 1603 and detection of the particular offset 1505 may be used to infer that encoder scale 305 and reference scale 306 are rotationally aligned. As such, that particular offset 1505 may be used to infer that micro pick up array 203 is aligned with a target substrate.

Figure 18:
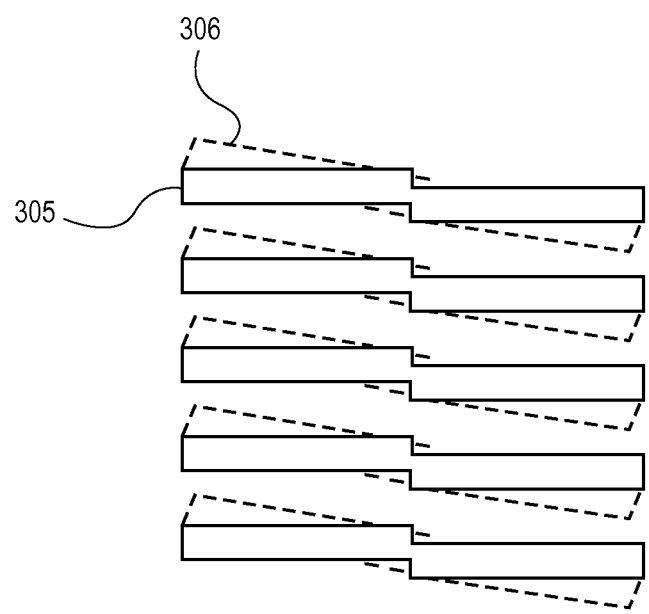
FIG. 18 is a pictorial view of an encoder scale rotationally misaligned with a reference scale in accordance with an embodiment of the invention.

Referring to FIG. 18, a pictorial view of an encoder scale rotationally misaligned with a reference scale is shown in accordance with an embodiment of the invention. In a case where encoder scale 305 and reference scale 306 are not angularly aligned with each other, parallel lines of encoder scale 305 will tilt relative to parallel lines of reference scale 306. As a result of this tilting, the light occlusion between first column 1501 of encoder scale 305 and reference scale 306 will be different from the light occlusion when encoder scale 305 and reference scale 306 are angularly aligned. The light occlusion between second column 1503 of encoder scale 305 and reference scale 306 will likewise be different between the angularly misaligned and the angularly aligned states.

In FIG. 18, encoder scale and reference scale may be aligned in a direction orthogonal to parallel lines. More particularly, encoder scale 305 and reference scale 306 may be in the same longitudinal position as the arrangement of FIG. 17. However, as a result of the angular misalignment, a maximum signal may be detected for both the A channel and the B channel, corresponding to minimal light occlusion between encoder scale 305 and reference scale 306 for both columns. In other words, signals corresponding to light passing through both columns may be approximately equal. Accordingly, the detected phase shift 1605 between signals may be approximately zero. Thus, for an angularly misaligned state, the phase shift 1605 will vary from that expected for an angularly aligned state. Based on the measured phase shift 1605, the degree of angular misalignment may be calculated.

As mentioned above, a dual-channel grating such as the one shown in FIG. 15 may be used as a single grating of encoder scale 305. Thus, encoder scale 305 may have a dual-channel grating to detect axial alignment in a first direction and to detect angular alignment between encoder scale 305 and reference scale 306. The dual-channel grating may be positioned adjacent to a second grating 603 used to detect axial alignment in a second direction as described above. Furthermore, encoder scale 305 having dual-channel gratings may be located in different quadrants or corners of micro pick up array 203 and/or a target substrate to allow for multiple measurements of angular alignment to be made about different locations. Micro pick up array 203 may then be rotated relative to a target substrate and angular alignment measurements may be repeated in an iterative manner until micro pick up array 203 is rotationally aligned with the target substrate within a predetermined tolerance. After being rotationally aligned, target locations on micro pick up array 203 and the target substrate can be correlated based on known distances between the determined reference locations and the target locations. Accordingly, distances between electrostatic transfer head 205 and micro devices 304 can be calculated and used to align an electrostatic transfer head 205 with a micro device 304.

Figure 19:
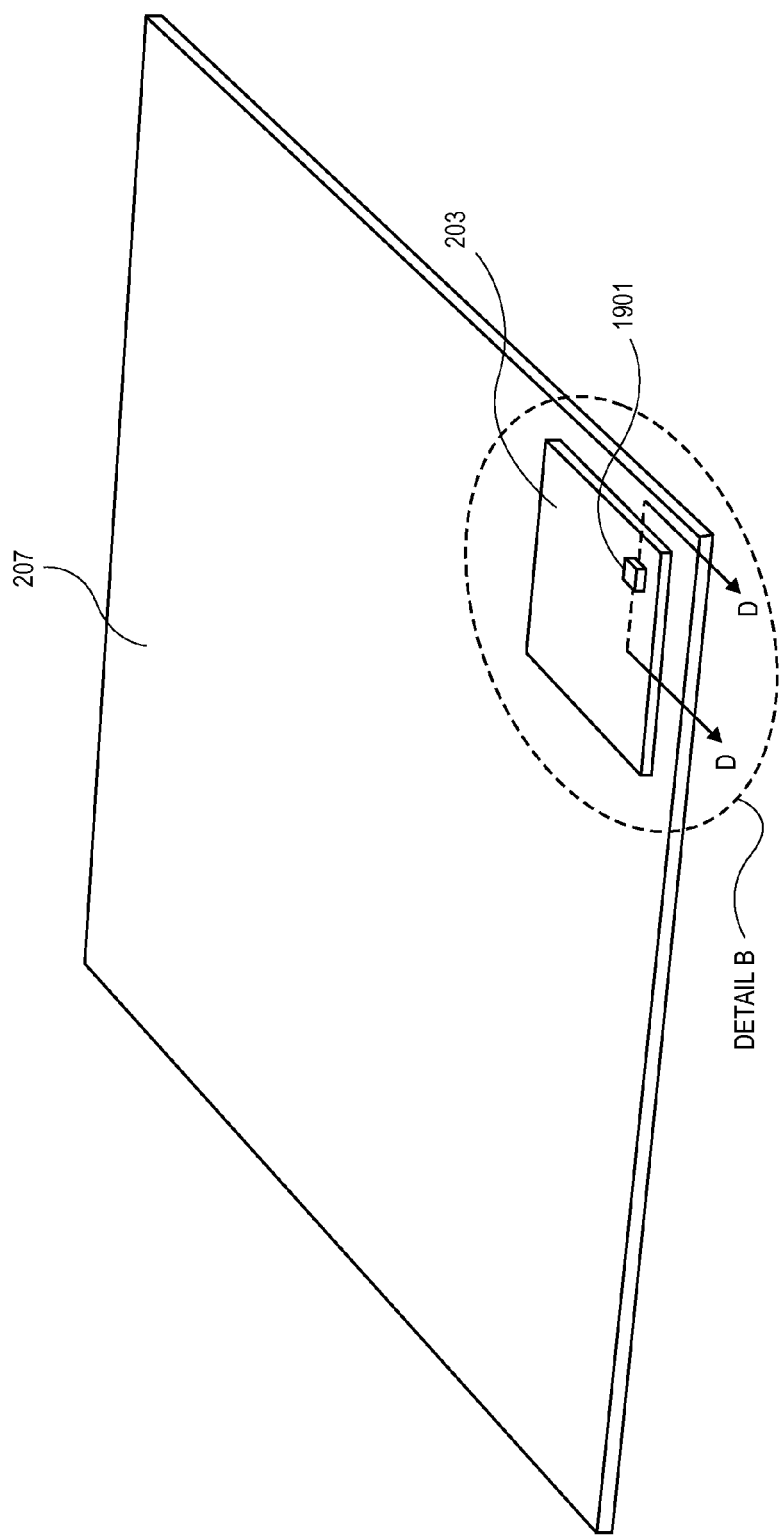
FIG. 19 is a perspective view of a micro pick up array alignment encoder having an encoder readhead over a micro pick up array and a carrier substrate in accordance with an embodiment of the invention.

Referring to FIG. 19, a perspective view of a micro pick up array alignment encoder having an encoder readhead over a micro pick up array and a carrier substrate is shown in accordance with an embodiment of the invention. Encoder readhead 1901 may be mounted on micro pick up array 203, or alternatively, encoder readhead 1901 may be coupled with a mount such as micro pick up array holder 110. As shown, micro pick up array 203 may have a considerably smaller surface area than carrier substrate 207, and thus, micro pick up array 203 may be moved across a distance equal to several times its own width in order to match encoder/reference scale 306 pairs in different corners of micro pick up array 203 and carrier substrate 207. Thus, micro pick up array 203 may need to hunt for a corresponding reference scale 306 on carrier substrate 207 as it is moved from a first reference location to a second reference location. This hunting can be expedited using vision systems to identify and roughly align the encoder/reference scale pairs.

Figure 20:
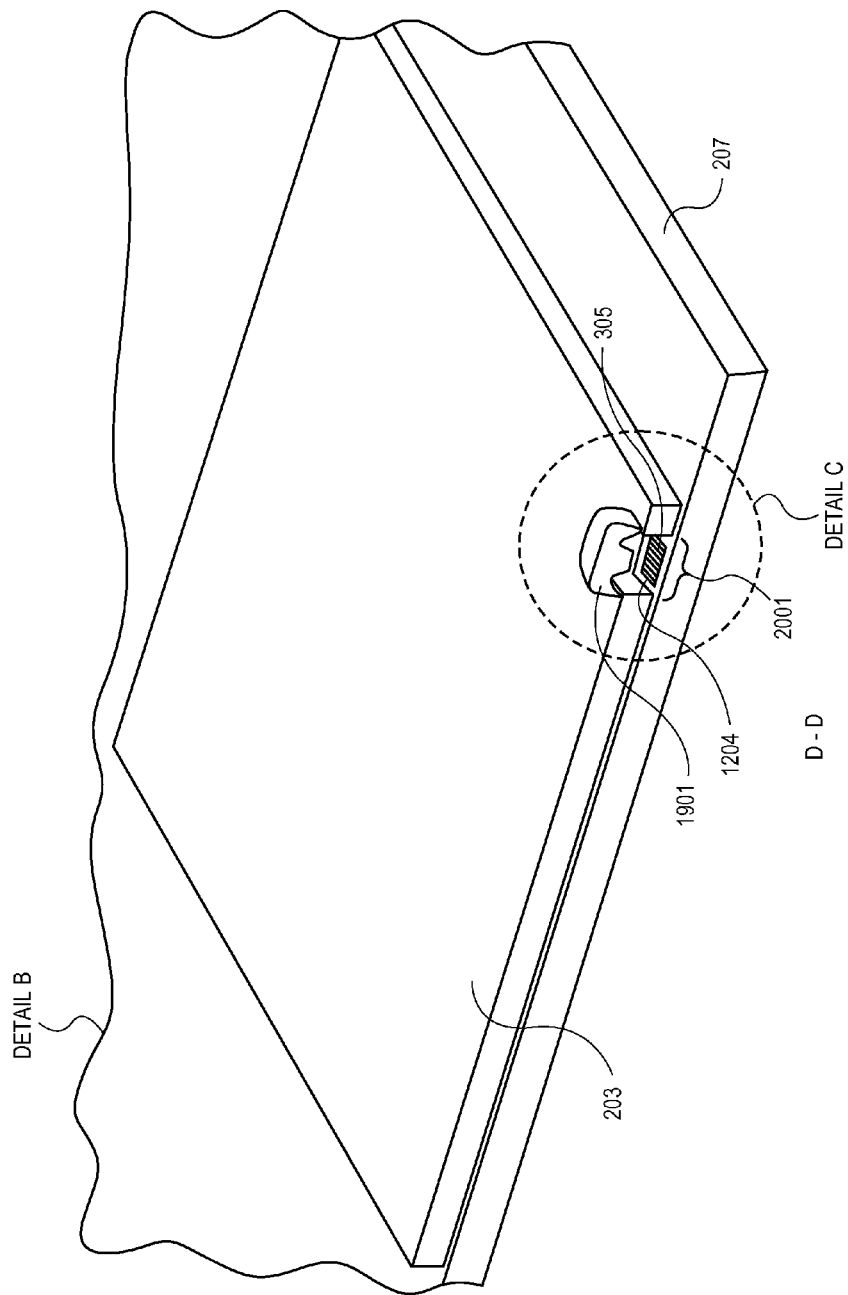
FIG. 20 is a detail view of a micro pick up array alignment encoder having an encoder readhead, taken about line D-D of Detail B of FIG. 19, in accordance with an embodiment of the invention.

Referring to FIG. 20, a detail view of a micro pick up array alignment encoder having an encoder readhead, taken about line D-D of Detail B of FIG. 19, is shown in accordance with an embodiment of the invention. The detail view includes a section view taken about line D-D of FIG. 19. Encoder readhead 1901 may be located over micro pick up array 203 and include a working face directed toward a window 2001 in micro pick up array 203. Window 2001 may extend around outer perimeter 1204 of encoder scale 305 on micro pick up array 203.

Figure 21:
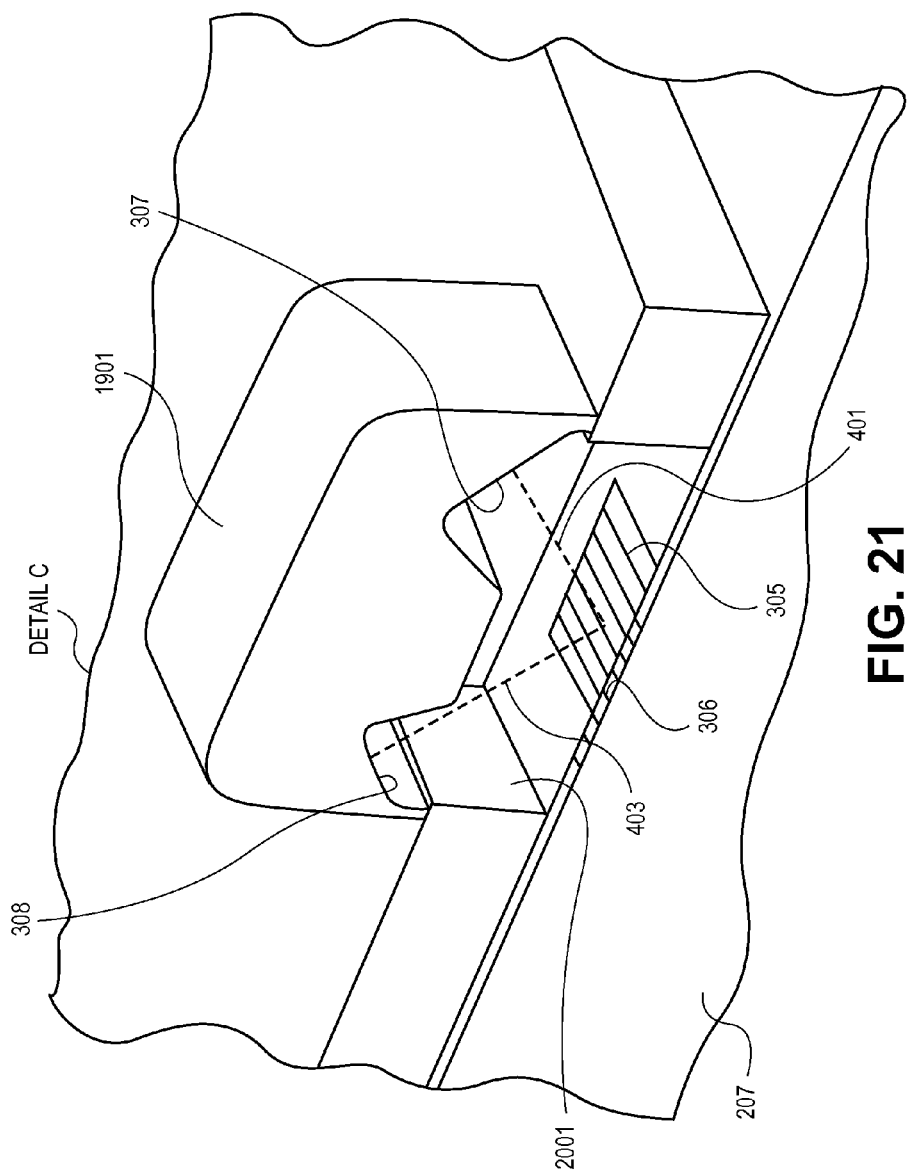
FIG. 21 is a detail view of an encoder readhead, taken from Detail C of FIG. 20, in accordance with an embodiment of the invention.

Referring to FIG. 21, a detail view of an encoder readhead, taken from Detail C of FIG. 20, is shown in accordance with an embodiment of the invention. In an embodiment, encoder readhead 1901 may include integrated light source 307 and photodetector 308. Light source 307 may be directed at an angle to project emitted light 401 through encoder scale 305 toward reference scale 306. In a reflection-type micro pick up array alignment encoder, emitted light 401 may reflect from reference scale 306 back toward photodetector 308 in encoder readhead 1901. Alternatively, in a case of a transmissive-type micro pick up array alignment encoder, photodetector 308 may be located within carrier substrate 207 such that emitted light 401 transmits through both encoder scale 305 and reference scale 306 to be detected by photodetector 308.

Figure 22:
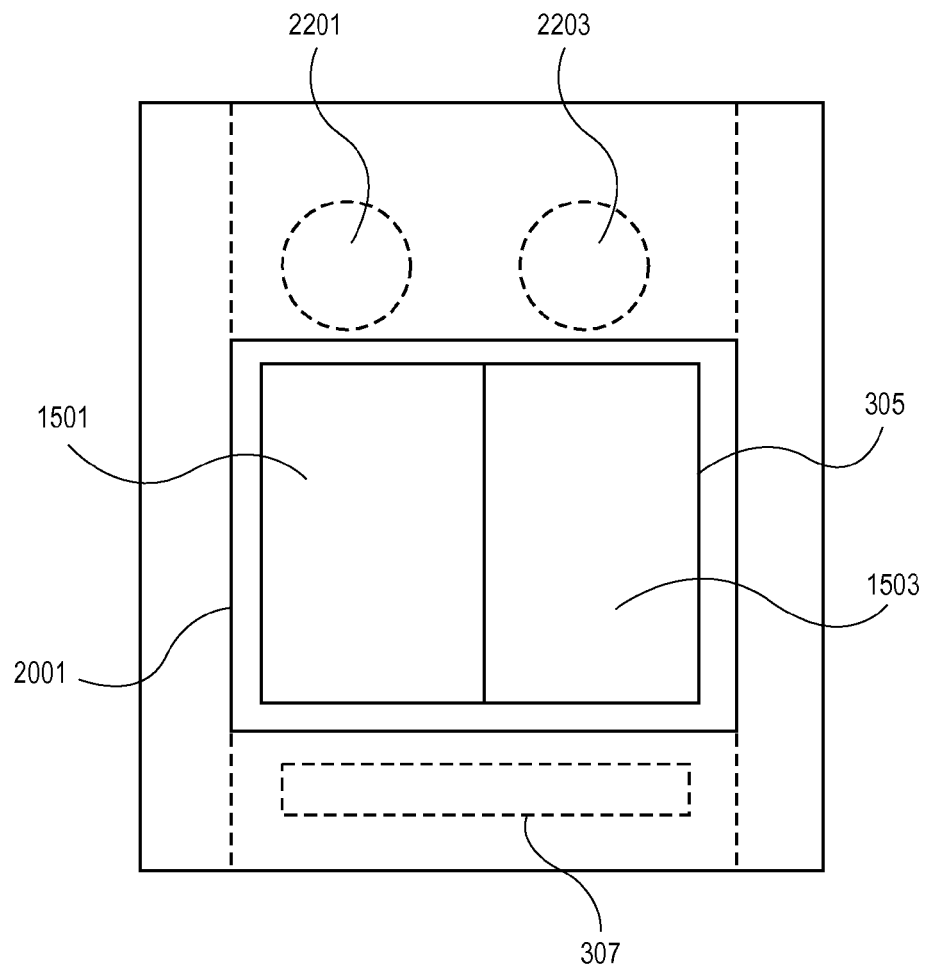
FIG. 22 is a partial bottom view of an encoder readhead in accordance with an embodiment of the invention.

Referring to FIG. 22, a partial bottom view of an encoder readhead is shown in accordance with an embodiment of the invention. In the case of a dual-channel grating in encoder scale 305, a single light source 307 may be used to project light through first column 1501 and second column 1503 of encoder scale 305 within window 2001. However, multiple photosensors, such as 'A' channel photodetector 2201 and 'B' channel photodetector 2203 may be used to receive and convert light passing through individual columns of encoder scale 305 into first column signal 1601 and second column signal 1603 for processing.

Multiple encoder readheads 1901 may be used to provide signals for individual encoder scale 305 or encoder scale gratings. For example, a separate encoder readhead 1901 may be positioned over each grating of an encoder scale 305 in order to transmit and receive light, and to convert the received light into signals for detecting positional alignment of encoder/reference scale pairs in different directions. Each of these signals may be processed to provide data for determining positional and angular alignment of micro pick up array 203 relative to carrier substrate 207.

Figure 23:
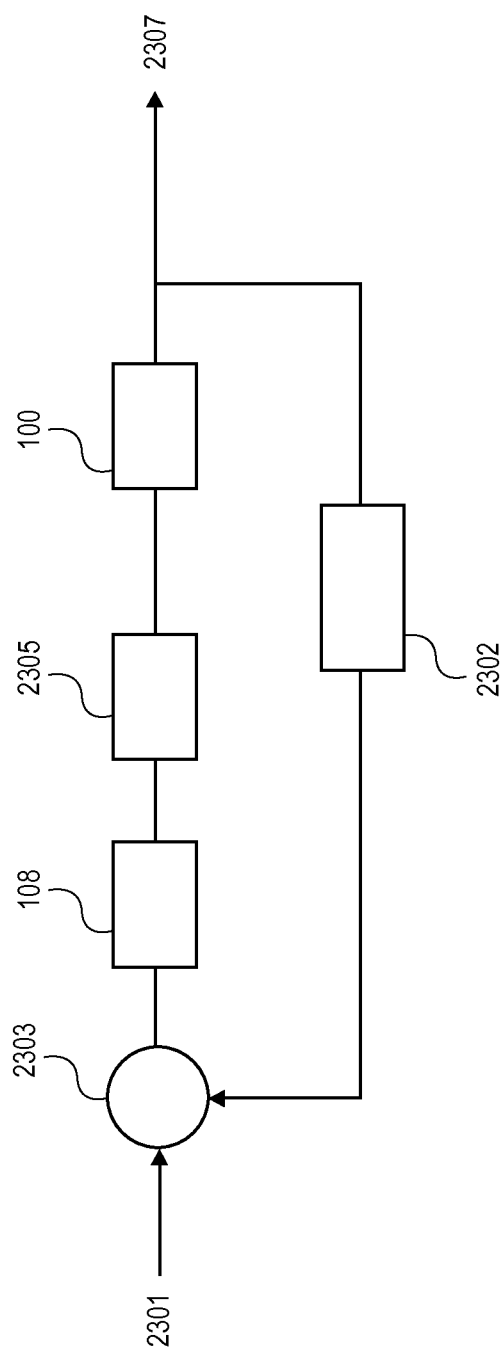
FIG. 23 is a schematic illustration of a control loop to regulate alignment between a micro pick up array and a target substrate in accordance with an embodiment of the invention.

Referring to FIG. 23, a schematic illustration of a control loop to regulate alignment between a micro pick up array and a target substrate is shown in accordance with an embodiment of the invention. In an embodiment, the control loop may be closed to achieve the goal of aligning micro pick up array 203 with carrier substrate 207. In an embodiment, a setpoint may define a set of reference signals that correspond to an anticipated dual-channel signal corresponding to first column signal 1601 and second column signal 1603. Actual first column signal 1601 and second column signal 1603 may be provided by encoder readhead 1901 as an input 2301 or as feedback 2302 to alignment sensing module 2303. Alignment sensing module 2303 may process the received signals related to a current state of alignment between micro pick up array 203 and carrier substrate 207. More specifically, alignment sensing module 2303 may perform signal processing to calculate, or deliver processed signals to computer system 108 for calculation of, e.g., an error signal. Error signal may correspond for example to a difference in phase shift 1605 between the expected and the actual detected light. Based on the error signal, computer system 108 may use a control algorithm to determine appropriate control commands to actuate various actuators of mass transfer tool 100 to rotationally align micro pick up array 203 with carrier substrate 207. For example, a command signal may be delivered to a servo motor in mass transfer tool 100 to cause micro pick up array holder 110 to rotate in space relative to carrier substrate holder 104 and/or x-y stage 112 may be controlled to translate micro pick up array 203 relative to carrier substrate 207. These control signals may be delivered directly to the relevant actuator, such as the servo motor, or they may be modified, e.g., by increasing control signal power, with amplifier 2305. Signals from the encoder readhead 1901 may continue to be provided as feedback 2302 to alignment sensing module 2303 to continue to adjust mass transfer tool 100 until output 2307 equals the setpoint, i.e., until actual signals provided by encoder readhead 1901 correspond with a set of signals that are expected to indicate alignment between micro pick up array 203 with carrier substrate 207. Although this summary of a control loop is described in the context of controlling angular alignment, similar control loops may be used to control positional alignment to move an electrostatic transfer head 205 of micro pick up array 203 into alignment with a micro device 304 of carrier substrate 207.

Figure 24:
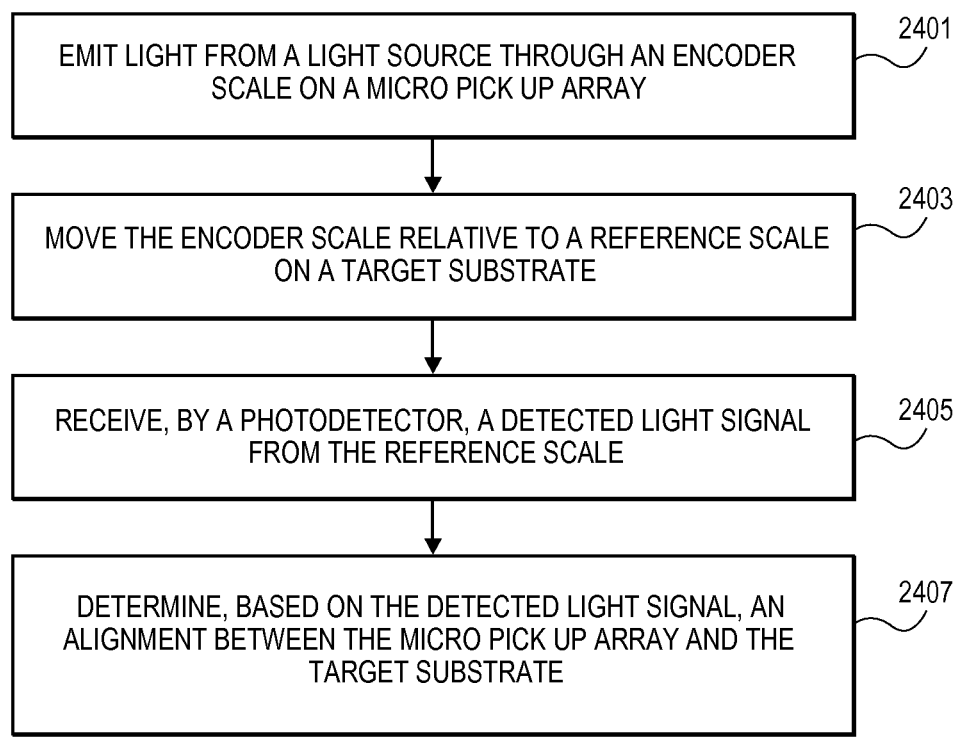
FIG. 24 is a flowchart illustrating a method of determining alignment between a micro pick up array and a target substrate in accordance with an embodiment of the invention.

Referring to FIG. 24, a flowchart illustrating a method of determining alignment between a micro pick up array and a target substrate is shown in accordance with an embodiment of the invention. Prior to initiating the alignment method, micro pick up array 203 may be moved over carrier substrate 207 until encoder scale 305 is roughly aligned with reference scale 306. This movement may be controlled based on known coordinates generated using, e.g., an upward-looking camera 303 coupled with carrier substrate 207. Once an approximate alignment between an encoder/reference scale pair is achieved, at operation 2401 light source 307 may emit light through encoder scale 305 of micro pick up array 203 toward photodetector 308. As described above, light source 307 may be integrated within mass transfer tool 100 or within a component, such as encoder readhead 1901. At operation 2403, encoder scale 305 may be moved relative to reference scale 306. Movement may be provided by one or more actuator of mass transfer tool 100 that provides both translational and rotational motion between encoder scale 305 and reference scale 306. At operation 2405, a portion of emitted light 401 from light source 307 may be detected using photodetector 308. Detected light 403 may only be a fraction of emitted light 401 that was initially projected by light source 307, including only that portion of emitted light 401 that is transmitted through or reflected from reference scale 306. Photodetector 308 may be used to continuously sense light from light source 307, or it may intermittently sample light to generate a signal over time. The generated signal may be plotted against relative position of encoder scale 305 and reference scale 306. At operation 2407, one or more signal corresponding to light received by photodetector 308 may be processed to determine alignment between encoder scale 305 and reference scale 306. The determination of alignment may include determination of alignment in different directions within a plane, as well as determination of angular alignment, between encoder scale 305 and reference scale 306. For example, as described above, first column signal 1601 and second column signal 1603 may be plotted against relative position. The signals may be processed to measure phase shift 1605 and thereby infer an angular alignment between micro pick up array 203 and carrier substrate 207. Additionally, positional alignment may be determined by identifying positions at which a signal corresponding to detected light 403 reaches a maximum in different directions. The positions may be treated as datums and combined to define relative locations. Thus, based on the detected light 403, positional and angular alignment between micro pick up array 203 and carrier substrate 207 may be determined and adjusted by mass transfer tool 100 until the desired relative position is achieved.

Following alignment of micro pick up array 203 and carrier substrate 207, micro pick up array 203 may be used to bring array of electrostatic transfer head 205 on micro pick up array 203 into proximity with micro devices 304 on carrier substrate 207. Electrostatic transfer head 205 may apply an electrostatic gripping force to micro devices 304 and pick up the micro devices 304 from carrier substrate 207. Then, micro pick up array 203 may be moved toward a receiving substrate 1101, such as a display, to transfer the micro devices 304 to the display.

Prior to transferring the micro devices 304 to the receiving substrate 1101, micro pick up array 203 may be aligned with the receiving substrate 1101 using a method similar to that described with respect to FIG. 24. Vision systems may be used to roughly align encoder scale 305 on micro pick up array 203 with reference scale 306 on the receiving substrate 1101. Additional fine alignment between encoder scale 305 on micro pick up array 203 and reference scale 306 on the receiving substrate 1101 may be achieved based on the detection and processing of light signals received by photodetectors 308. Finally, after fine alignment is achieved and a relative position between electrostatic transfer head 205 on micro pick up array 203 and pixel locations on the receiving substrate 1101 is known, micro devices 304 may be placed on the receiving substrate 1101 by bringing the micro devices 304 into proximity with the display surface and removing the electrostatic voltage to release the electrostatic gripping force that retains the micro devices 304.

The alignment process between micro pick up array 203 and either carrier substrate 207 or receiving substrate 1101 may be performed prior to an initial micro device 304 transfer process, and then again after several other transfer processes have occurred. Once the individual reference locations are determined, those locations may be registered and assumed to not shift until either numerous transfers have occurred or until micro pick up array 203, carrier substrate 207, or receiving substrate 1101 have been replaced. Thus, the alignment process described above may be performed at intervals.

Figure 25:
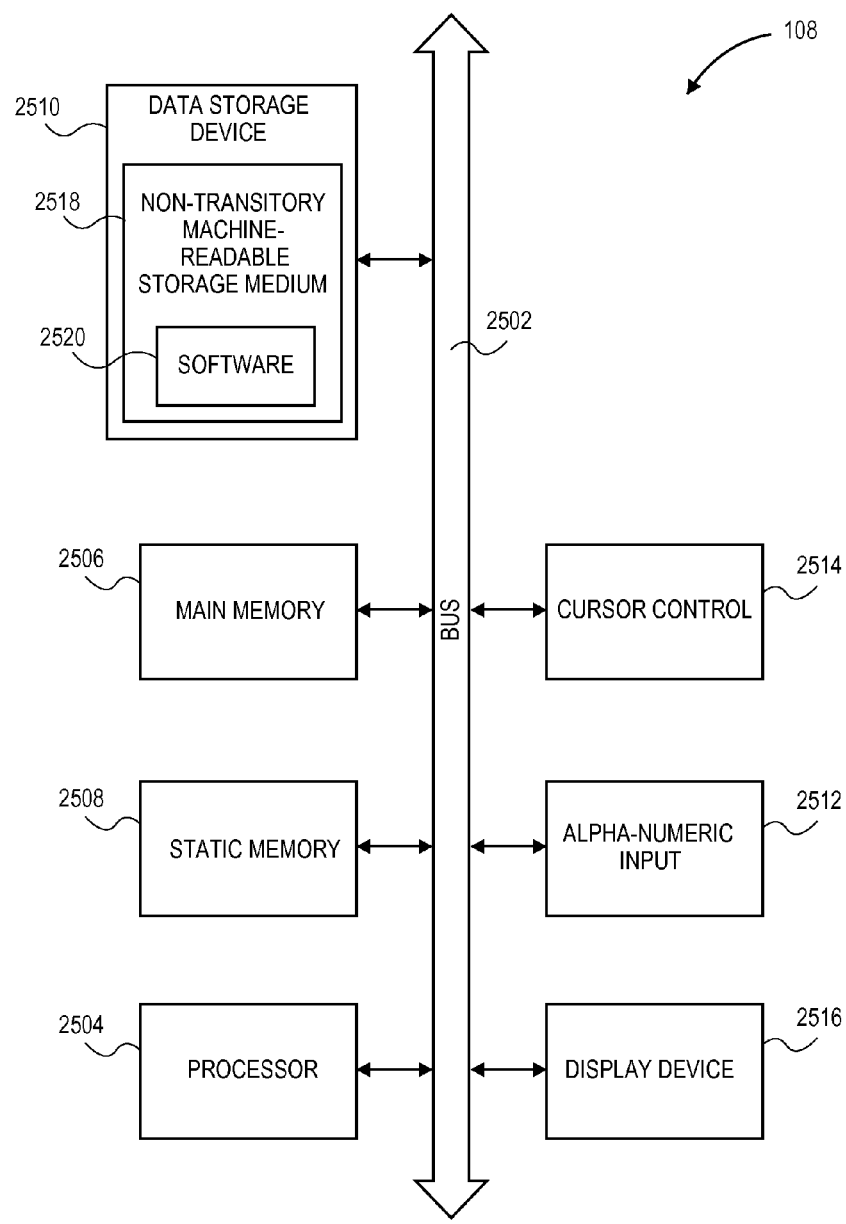
FIG. 25 is a schematic illustration of computer system that may be used in accordance with an embodiment of the invention.

Referring to FIG. 25, a schematic illustration of computer system that may be used is shown in accordance with an embodiment of the invention. Portions of embodiments of the invention are comprised of or controlled by non-transitory machine-readable and machine-executable instructions which reside, for example, in machine-usable media of a computer system 108. Computer system 108 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Furthermore, although some components of a control system, e.g., amplifier 2305 and alignment sensing module 2303, have been broken out for discussion separately above, computer system 108 may integrate those components directly or include additional components that fulfill similar functions.

Computer system 108 of FIG. 25 includes an address/data bus 2502 for communicating information, and a central processor unit 2504 coupled to bus 2502 for processing information and instructions. Computer system 108 also includes data storage features such as a computer usable volatile memory 2506, e.g. random access memory (RAM), coupled to bus 2502 for storing information and instructions for central processor unit 2504, computer usable non-volatile memory 2508, e.g. read only memory (ROM), coupled to bus 2502 for storing static information and instructions for the central processor unit 2504, and a data storage device 2510 (e.g., a magnetic or optical disk and disk drive) coupled to bus 2502 for storing information and instructions. Computer system 108 of the present embodiment also includes an optional alphanumeric input device 2512 including alphanumeric and function keys coupled to bus 2502 for communicating information and command selections to central processor unit 2504. Computer system 108 also optionally includes an optional cursor control device 2514 coupled to bus 2502 for communicating user input information and command selections to central processor unit 2504. Computer system 108 of the present embodiment also includes an optional display device 2516 coupled to bus 2502 for displaying information.

The data storage device 2510 may include a non-transitory machine-readable storage medium 2518 on which is stored one or more sets of instructions (e.g. software 2520) embodying any one or more of the methodologies or operations described herein. Software 2520 may also reside, completely or at least partially, within the computer usable volatile memory 2506, computer usable non-volatile memory 2508, and/or within central processor unit 2504 during execution thereof by the computer system 108, the computer usable volatile memory 2506, computer usable non-volatile memory 2508, and/or central processor unit 2504 also constituting non-transitory machine-readable storage media.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A micro pick up array comprising:
   a base substrate;
   an array of electrostatic transfer heads on the base substrate, the array of electrostatic transfer heads supported by the base substrate, each electrostatic transfer head to receive electrostatic voltage to generate an electrostatic gripping force; and
   an encoder scale on the base substrate, wherein the encoder scale is spaced apart from the array of electrostatic transfer heads.

2. The micro pick up array of claim 1, further comprising an oxide layer over the base substrate, wherein the array of electrostatic transfer heads are supported by a top surface of the oxide layer, and wherein the encoder scale is supported by the top surface of the oxide layer.

3. The micro pick up array of claim 2, wherein the encoder scale includes one or more grating having a plurality of parallel lines, and further comprising a hole in the base substrate opposite and below the grating to permit light passing toward the oxide layer to transmit freely through the base substrate.

4. The micro pick up array of claim 3, wherein the grating includes an outer perimeter, and wherein the hole includes a wall profile around the outer perimeter.

5. The micro pick up array of claim 2, wherein the encoder scale includes one or more grating having a plurality of parallel lines, wherein the one or more grating includes a grating having a first column of parallel lines and a second column of parallel lines, wherein the parallel lines in the first column and the parallel lines in the second column are offset from each other in a direction orthogonal to the parallel lines.

6. The micro pick up array of claim 5, wherein the first column is laterally adjacent to the second column.

7. The micro pick up array of claim 6, wherein the parallel lines in the first column and the parallel lines in the second column include a line width, and wherein the offset between parallel lines in the first column and the second column is less than the line width.

8. The micro pick up array of claim 2, wherein the encoder scale includes one or more grating having a plurality of parallel lines, wherein the one or more grating includes a pair of gratings, and wherein the pair of gratings includes a first grating having parallel lines orthogonal to parallel lines of a second grating.

9. The micro pick up array of claim 8, further comprising a plurality of encoder scales, each encoder scale located within a different quadrant of the base substrate.

10. A micro pick up array alignment encoder comprising:
    a micro pick up array including:
    a base substrate,
    an array of electrostatic transfer heads on the base substrate, the array of electrostatic transfer heads supported by the base substrate, each electrostatic transfer head to receive electrostatic voltage to generate an electrostatic gripping force, and
    an encoder scale on the base substrate, wherein the encoder scale is spaced apart from the array of electrostatic transfer heads;
    a light source to emit light toward the encoder scale; and
    a photodetector to receive the emitted light.

11. The micro pick up array alignment encoder of claim 10, further comprising:
    an oxide layer over the base substrate, wherein the array of electrostatic transfer heads are supported by a top surface of the oxide layer, and wherein the encoder scale is supported by the top surface of the oxide layer.

12. The micro pick up array alignment encoder of claim 11, further comprising a target substrate having a reference scale, wherein the photodetector receives the emitted light from the reference scale, wherein the light source is coupled with the micro pick up array, and wherein the photodetector is coupled with the target substrate.

13. The micro pick up array alignment encoder of claim 12, wherein the encoder scale includes an encoder grating having a plurality of parallel first lines, and wherein the reference scale includes a reference grating having a plurality of parallel second lines.

14. The micro pick up array alignment encoder of claim 13, wherein the encoder grating includes an encoder grating width different from a reference grating width of the reference grating.

15. The micro pick up array alignment encoder of claim 14, wherein the quantity of parallel first lines equals the quantity of parallel second lines.

16. The micro pick up array alignment encoder of claim 14, wherein the encoder grating includes a first column of parallel first lines and a second column of parallel first lines, wherein the parallel first lines in the first column and the parallel first lines in the second column are offset from each other in a direction orthogonal to the parallel first lines.

17. The micro pick up array alignment encoder of claim 16, wherein the first column is laterally adjacent to the second column.

18. The micro pick up array alignment encoder of claim 17, wherein the parallel first lines in the first column and the parallel lines in the second column include a line width, and wherein the offset between parallel first lines in the first column and the second column is less than the line width.

19. The micro pick up array alignment encoder of claim 11, further comprising a target substrate having a reference scale, wherein the photodetector receives the emitted light from the reference scale, and wherein the target substrate includes a carrier substrate having an array of micro devices supported by a silicon substrate, the reference scale over the silicon substrate.

20. The micro pick up array alignment encoder of claim 11, further comprising a target substrate having a reference scale, wherein the photodetector receives the emitted light from the reference scale, and wherein the target substrate includes a receiving substrate having a thin film transistor (TFT) substrate including a pixel area and a non-pixel area, the reference scale over the non-pixel area.

21. The micro pick up array alignment encoder of claim 10, further comprising an oxide layer over the base substrate, wherein the array of electrostatic transfer heads are supported by a top surface of the oxide layer, wherein the encoder scale is supported by the top surface of the oxide layer.

22. The micro pick up array alignment encoder of claim 21, wherein the light source is an infrared light source, and wherein the infrared light source emits collimated light.

23. A method comprising:
emitting light from a light source through an encoder scale on a micro pick up array to a photodetector, wherein the micro pick up array includes an array of electrostatic transfer heads spaced apart from the encoder scale, each electrostatic transfer head to receive electrostatic voltage to generate an electrostatic gripping force, and wherein the encoder scale and the array of electrostatic transfer heads are supported by a base substrate of the micro pick up array;
moving the encoder scale relative to a reference scale on a target substrate;
receiving, by the photodetector, a detected light from the reference scale; and
determining, based on the detected light, an alignment between the micro pick up array and the target substrate.

24. The method of claim 23, wherein the emitted light transmits through the reference scale to the photodetector.

25. The method of claim 23, wherein the emitted light reflects from the reference scale to the photodetector.

26. The method of claim 23, further comprising detecting a peak value of the detected light, and wherein determining the alignment includes determining a linear alignment based on the peak value.

27. The method of claim 26, wherein the encoder scale includes a grating having a first column of parallel lines and a second column of parallel lines, wherein the parallel lines in the first column and the parallel lines in the second column are offset from each other in a direction orthogonal to the parallel lines, and wherein receiving the detected light includes receiving the emitted light passing through the first column with the photodetector and receiving the emitted light passing through the second column with a second photodetector.

28. The method of claim 27, further comprising:
comparing the detected light passing through the first column with the detected light passing through the second column; and
determining, based on the comparing, the alignment between the micro pick up array and the target substrate.

29. The method of claim 28, wherein detecting the peak value includes detecting the peak value in the emitted light passing through the first column and further comprising detecting a second peak value of the emitted light passing through the second column after moving the encoder scale relative to the reference scale by a phase shift distance.

30. The method of claim 29, further comprising measuring the phase shift distance, wherein determining the alignment includes determining an angular alignment based on the measured phase shift distance.

31. A non-transitory computer readable medium having instructions that when executed by a computer cause a micro pick up array alignment encoder to:
emit light from a light source through an encoder scale on a micro pick up array to a photodetector, wherein the micro pick up array includes an array of electrostatic transfer heads spaced apart from the encoder scale, each electrostatic transfer head to receive electrostatic voltage to generate an electrostatic gripping force, and wherein the encoder scale and the array of electrostatic transfer heads are supported by a base substrate of the micro pick up array;
move the encoder scale relative to a reference scale on a target substrate;
receive, by the photodetector, a detected light from the reference scale; and
determine, based on the detected light, an alignment between the micro pick up array and the target substrate.

* * * * *